US012222871B2

(12) United States Patent
Diep et al.

(10) Patent No.: US 12,222,871 B2
(45) Date of Patent: *Feb. 11, 2025

(54) METHODS AND APPARATUSES FOR ADDRESSING MEMORY CACHES

(71) Applicant: Rambus Inc., San Jose, CA (US)

(72) Inventors: Trung Diep, San Jose, CA (US); Hongzhong Zheng, Sunnyvale, CA (US)

(73) Assignee: RAMBUS INC., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/592,424

(22) Filed: Feb. 29, 2024

(65) Prior Publication Data

US 2024/0273032 A1     Aug. 15, 2024

Related U.S. Application Data

(63) Continuation of application No. 17/986,781, filed on Nov. 14, 2022, now Pat. No. 11,921,642, which is a
(Continued)

(51) Int. Cl.
*G06F 12/1009* (2016.01)
*G06F 12/0811* (2016.01)
(Continued)

(52) U.S. Cl.
CPC ...... *G06F 12/1009* (2013.01); *G06F 12/0811* (2013.01); *G06F 12/0864* (2013.01);
(Continued)

(58) Field of Classification Search
CPC .............. G06F 12/1009; G06F 12/0811; G06F 12/0864; G06F 2212/283; G06F 2212/656
See application file for complete search history.

(56) References Cited

U.S. PATENT DOCUMENTS 5,809,562 A    9/1998  Gaskins et al.
6,253,285 B1   6/2001  Razdan et al.
(Continued)

FOREIGN PATENT DOCUMENTS

EP          0841619         5/1998

OTHER PUBLICATIONS

International Search Report with mail date of Sep. 25, 2012 and the Written Opinion re Int'l. Application No. PCT/US2012/026027. 10 Pages.

*Primary Examiner* — Gurtej Bansal
(74) *Attorney, Agent, or Firm* — Morgan, Lewis & Bockius LLP

(57) ABSTRACT

A cache memory includes cache lines to store information. The stored information is associated with physical addresses that include first, second, and third distinct portions. The cache lines are indexed by the second portions of respective physical addresses associated with the stored information. The cache memory also includes one or more tables, each of which includes respective table entries that are indexed by the first portions of the respective physical addresses. The respective table entries in each of the one or more tables are to store indications of the second portions of respective physical addresses associated with the stored information.

20 Claims, 12 Drawing Sheets

Related U.S. Application Data continuation of application No. 17/107,831, filed on Nov. 30, 2020, now Pat. No. 11,500,781, which is a continuation of application No. 16/157,908, filed on Oct. 11, 2018, now Pat. No. 10,853,261, which is a continuation of application No. 15/393,232, filed on Dec. 28, 2016, now Pat. No. 10,102,140, which is a continuation of application No. 14/001,464, filed as application No. PCT/US2012/026027 on Feb. 22, 2012, now Pat. No. 9,569,359.

(60) Provisional application No. 61/446,451, filed on Feb. 24, 2011.

(51) Int. Cl.
*G06F 12/0864* (2016.01)
*G11C 7/10* (2006.01)

(52) U.S. Cl.
CPC ...... *G11C 7/1072* (2013.01); *G06F 2212/283* (2013.01); *G06F 2212/656* (2013.01)

(56) References Cited

U.S. PATENT DOCUMENTS

| | | | |
|---|---|---|---|
| 7,512,750 | B2 | 3/2009 | Newburn et al. |
| 7,546,417 | B1 | 6/2009 | Rajamony et al. |
| 2006/0271723 | A1 | 11/2006 | Visalli et al. |
| 2006/0277352 | A1 | 12/2006 | Pong |
| 2007/0050540 | A1 | 3/2007 | Klein |
| 2008/0109606 | A1 | 5/2008 | Lataille et al. |
| 2008/0189487 | A1 | 8/2008 | Craske |
| 2008/0229026 | A1* | 9/2008 | Chung ............ G06F 3/0683 711/132 |
| 2010/0088457 | A1 | 4/2010 | Goodrich et al. |
| 2010/0250836 | A1 | 9/2010 | Sokolov et al. |
| 2011/0289257 | A1 | 11/2011 | Hathaway et al. |

* cited by examiner

METHODS AND APPARATUSES FOR ADDRESSING MEMORY CACHES

RELATED APPLICATIONS

This application is a continuation of U.S. patent application Ser. No. 17/986,781, filed Nov. 14, 2022, which is a continuation of U.S. patent application Ser. No. 17/107,831, filed Nov. 30, 2020, now U.S. Pat. No. 11,500,781, which is a continuation of U.S. patent application Ser. No. 16/157,908, filed Oct. 11, 2018, now U.S. Pat. No. 10,853,261, which is a continuation of U.S. patent application Ser. No. 15/393,232, filed Dec. 28, 2016, now U.S. Pat. No. 10,102,140, which is a continuation of U.S. patent application Ser. No. 14/001,464, filed Aug. 23, 2013, now U.S. Pat. No. 9,569,359, which is a United States National Stage Application filed under 35 U.S.C. § 371 of PCT Patent Application Serial No. PCT/US2012/026027, filed Feb. 22, 2012, which claims the benefit of and priority to U.S. Provisional Patent Application No. 61/446,451, filed Feb. 24, 2011, all of which are hereby incorporated by reference in their entireties.

TECHNICAL FIELD

The disclosed embodiments relate generally to memory systems, and more particularly, to the design and operation of cache memories.

BACKGROUND

Cache memory design presents significant engineering challenges. For example, as cache sizes have increased, the amount of cache memory allocated for storing tags has increased. Tag storage also increases as the degree of set associativity increases. Tag storage can be reduced by increasing block size, for example, but at the expense of reduced cache efficiency. The die area associated with tag storage is not used for storing information to be accessed by a processor or memory controller, and thus is overhead. This overhead will continue to increase as cache sizes continue to increase. Accordingly, there is a need for new cache memory architectures with reduced overhead.

BRIEF DESCRIPTION OF THE DRAWINGS

Like reference numerals refer to corresponding parts throughout the drawings.

DESCRIPTION OF EMBODIMENTS

Figure 1:
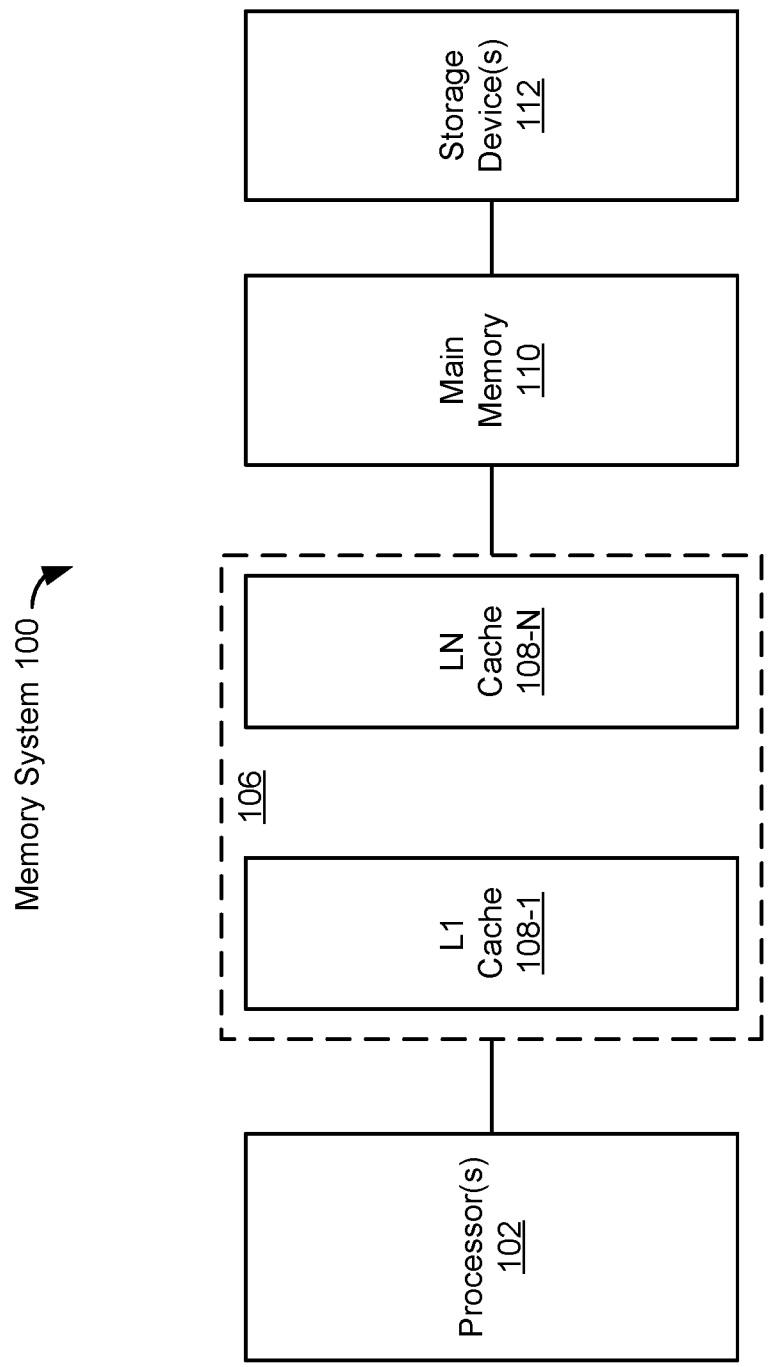
FIG. 1 illustrates a memory system.

In one aspect, a cache memory includes cache lines to store information. The stored information is associated with physical addresses that include first, second, and third distinct portions. The cache lines are indexed by the second portions of respective physical addresses associated with the stored information. The cache memory also includes one or more tables, each of which includes respective table entries that are indexed by the first portions of the respective physical addresses. The respective table entries in each of the one or more tables store indications of the second portions of respective physical addresses associated with the stored information.

In another aspect, an integrated circuit includes circuitry to determine whether a cache memory contains a cache line allocated to store information. The information is associated with physical addresses that include a specified physical address. The physical addresses each include first, second, and third portions: the first portions correspond to groups of most-significant address bits, the third portions correspond to groups of least-significant address bits, and the second portions correspond to groups of address bits between the most-significant address bits and the least-significant address bits. The circuitry includes one or more tables, each of which includes respective table entries that are indexed by the first portions of respective physical addresses. The respective table entries in each of the one or more tables store indications of the second portions of respective physical addresses. The circuitry also includes logic to determine whether the second portion of a specified physical address matches the indication stored in a table entry indexed by the first portion of the specified physical address.

In yet another aspect, a method of operating a cache memory includes storing information in cache lines. The stored information is associated with physical addresses that each include first, second, and third distinct portions. The cache lines are indexed by the second portions of respective physical addresses associated with the stored information. The method also includes storing indications of the second portions of physical addresses associated with the stored information. The indications are stored in one or more tables, indexed by the first portions of the respective physical addresses.

It will also be understood that, although the terms "first," "second," etc. may be used herein to describe various elements, these elements should not be limited by these terms. These terms are only used to distinguish one element from another. For example, a first portion could be termed a second portion, and, similarly, a second portion could be termed a first portion, without changing the meaning of the description, so long as all occurrences of the "first portion" are renamed consistently and all occurrences of the second portion are renamed consistently. The first portion and the second portion are both portions, but they are not the same portion.

The terminology used in the description of the invention herein is for the purpose of describing particular embodiments only and is not intended to be limiting. As used in the description of embodiments and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in accordance with a determination" or "in response to detecting," that a stated condition precedent is true, depending on the context. Similarly, the phrase "if it is determined [that a stated condition precedent is true]" or "if [a stated condition precedent is true]" or "when [a stated condition precedent is true]" may be construed to mean "upon determining" or "in response to determining" or "in accordance with a determination" or "upon detecting" or "in response to detecting" that the stated condition precedent is true, depending on the context.

Reference will now be made in detail to various embodiments, examples of which are illustrated in the accompanying drawings. In the following detailed description, numerous specific details are set forth in order to provide a thorough understanding of the present inventions. However, the present inventions may be practiced without these specific details. In other instances, well-known methods, procedures, components, and circuits have not been described in detail so as not to unnecessarily obscure aspects of the embodiments.

FIG. 1 illustrates a memory system 100, in which one or more central processing units (processor(s)) 102 are coupled to a cache memory 106. Cache memory 106 includes N levels 108-1 through 108-N of cache storage, where N is an integer greater than or equal to one. For example, cache memory 106 includes one level 108-1, or two levels, or three levels, or four or more levels of cache storage. The cache memory levels are sometimes designated as L1, L2 . . . LN, where L1 is the smallest and LN is the largest. Each level 108 of cache memory 106 has a greater information storage capacity and thus is larger than the previous level. One or more levels 108 of cache memory 106 may include multiple caches. For example, the Level 1 cache 108-1 may include an instruction cache to store instructions to be executed by processor(s) 102 and a data cache to store data to be processed in accordance with instructions executed by processor(s) 102. Cache memory 106 is connected to main memory 110, which is connected to one or more storage devices 112 (e.g., one or more magnetic disk storage devices, optical disk storage devices, flash memory devices, or other non-volatile solid state storage devices). The one or more storage devices 112 provide greater information storage capacity than main memory 110, which has greater information storage capacity than cache memory 106. In some embodiments, processor(s) 102 are coupled to main memory 110, storage device(s) 112, and/or one or more levels 108 of cache memory 106 through a memory controller (not shown). In some embodiments, each storage level in memory system 100 stores a subset of the information stored in the next storage level. For example, a first level 108-1 of the cache 106 stores a subset of the information stored in the second level 108-2, the Nth level 108-N of the cache 106 stores a subset of the information stored in main memory 110, and main memory 110 stores a subset of the information stored in the one or more storage devices 112. The term information as used herein includes instructions (e.g., instructions to be executed by processor(s) 102), data (e.g., data to be processed in accordance with instructions executed by processor(s) 102), and/or a combination of instructions and data.

Figure 2A:
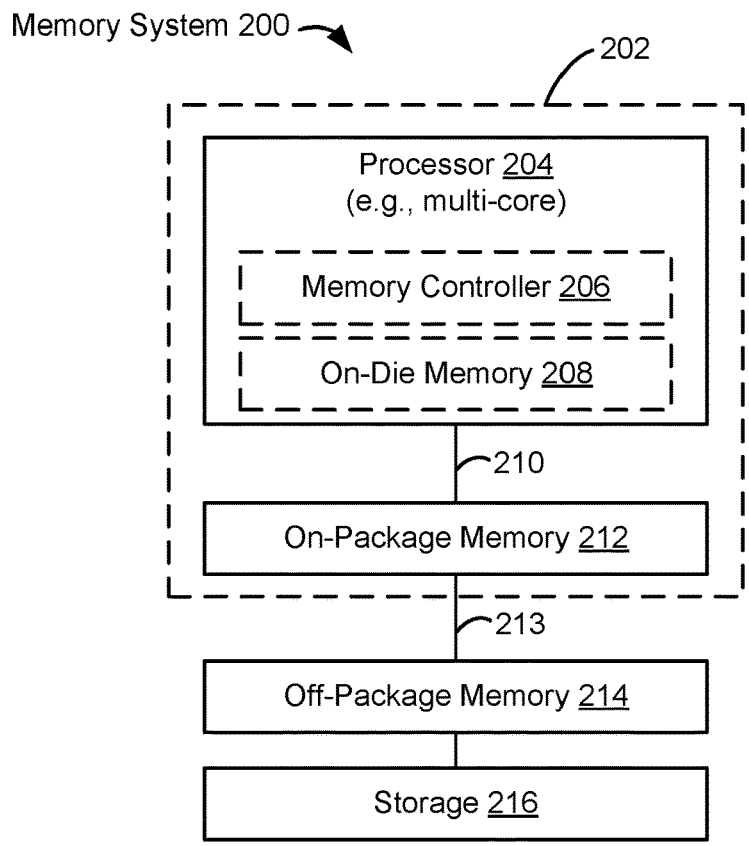
FIGS. 2A and 2B illustrate memory systems in accordance with some embodiments.

FIG. 2A illustrates a memory system 200 in which a processor 204 (e.g., a multi-core processor) is situated in a package 202 (e.g., a ball-grid array (BGA) or land-grid array (LGA) package) in accordance with some embodiments. On-die memory 208 and, in some embodiments, a memory controller 206 are fabricated on the same die as processor 204. On-package memory 212 is fabricated on one or more dice that are included in the package 202 and are separate from the die on which processor 204 is fabricated. For example, the dice on which processor 204 and on-package memory 212 are respectively fabricated are stacked in the package 202. In some embodiments, processor 204 and on-package memory 212 are coupled to each other using through-silicon vias (TSVs), illustrated schematically by the connection 210 in FIG. 2A. In some embodiments, the on-die memory 208 is static random-access memory (SRAM) and the on-package memory 212 is dynamic random-access memory (DRAM). Alternately, the on-package memory 212 and/or on-die memory 208 is (or includes) flash memory, magnetic random-access memory (MRAM), ferroelectric random-access memory (FeRAM), phase change memory, or other memory technology.

The package 202 is connected via a memory bus 213 to off-package memory 214, which is situated in one or more packages that are separate from the package 202. The term "off-package" thus indicates that the off-package memory 214 is not included in the package 202. In some embodiments, the off-package memory 214 includes DRAM, flash, MRAM, FeRAM, phase change memory, or some combination thereof. In some embodiments, the on-package memory 212 and the off-package memory 214 use the same memory technology. For example, the on-package memory 212 uses the same memory technology as the off-package memory 214 but is a higher performance and/or higher cost memory than the off-package memory 214. The off-package memory 214 is connected to storage 216 via one or more I/O connections.

Processor 204 and storage 216 are examples of processor(s) 102 and storage devices 112 (FIG. 1), respectively. In some embodiments, the on-die memory 208 includes one or more levels 108 of cache memory 106, and the on-package memory 212 includes one or more additional levels 108 of cache memory 106. For example, the on-die memory 208 includes Level 1, Level 2, and Level 3 cache, and the on-package memory 212 includes Level 4 cache. In another example, the on-die memory 208 includes Level 1 and Level 2 cache and the on-package memory 212 includes Level 3 and Level 4 cache. In some embodiments, the off-package memory 214 is an example of main memory 110 (FIG. 1). Alternatively, the off-package memory 214 includes main memory 110 (FIG. 1) and also includes one or more upper levels of cache memory 106 (FIG. 1).

Figure 2B:
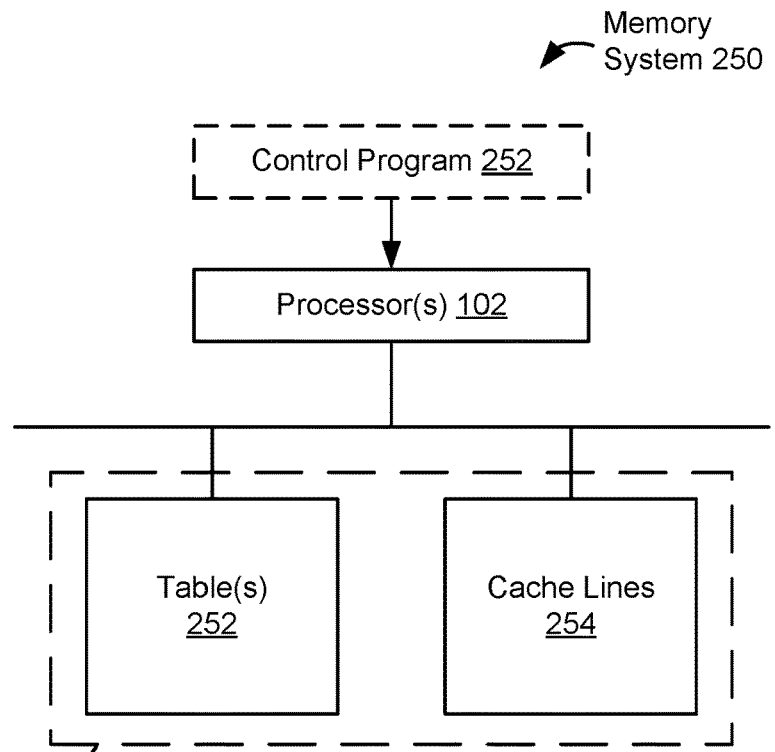

FIG. 2B illustrates a memory system 250 in which the processor(s) 102 operate under the direction of a control program 252. Processor(s) 102 are coupled to a Level n cache memory 108-$n$, where n is an integer between 1 and N. While FIG. 2B shows processor 102 as being directly connected to the Level n cache 108-$n$, in some embodiments processor 102 is coupled to the Level n cache 108-$n$ via a memory controller and one or more lower levels of cache. The Level n cache 108-$n$ includes one or more tables 252 and a set of cache lines 254. Examples of the Level n cache 108-$n$ include cache 320 (FIG. 3B), cache 400 (FIG. 4A), cache 420 (FIG. 4B), cache 600 (FIG. 6A), cache 620 (FIG.

6B), and cache 640 (FIG. 6C) described below. Examples of the one or more tables 252 include table 310 (FIG. 3B), table 402 (FIG. 4A), tables 402-1 through 402-n (FIG. 4B), tables 602-1 through 602-n (FIG. 6A-6B), and tables 642-1 through 642-n (FIG. 6C). Examples of the set of cache lines 254 include the set of cache lines stored in cache line array 326 (FIGS. 3B, 4A-4B, and 6A-6C).

In some embodiments, the table(s) 252 and cache lines 254 are both situated in the on-package memory 212, the on-die memory 208, or the off-package memory 214. In other embodiments, the table(s) 252 are situated in the on-die memory 208 and the cache lines 254 are situated in the on-package memory 212. For example, the table(s) 252 are implemented in SRAM in the on-die memory 208 and the cache lines 254 are implemented in DRAM in the on-package memory 212. In still other embodiments, the table(s) 252 are situated in the on-package memory 212 and the cache lines 254 are situated in the off-package memory 214. Other combinations are possible.

Figure 3A:
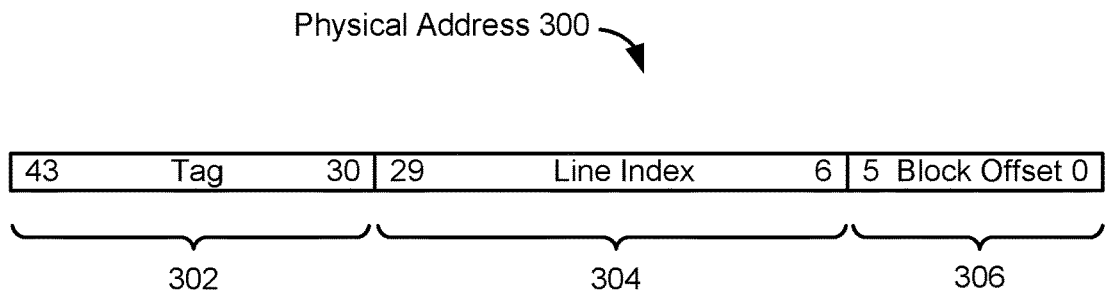
FIG. 3A illustrates a physical address associated with information stored in a system in accordance with some embodiments.

FIG. 3A illustrates a physical address 300 associated with information stored in a system such as the memory system 100 (FIG. 1) or 200 (FIG. 2A) in accordance with some embodiments. Each instance of the physical address 300 is the address of a memory location storing a set of data (e.g., one word of data, where a word typically comprises 16, 32, 64, 128 or 256 bits of data, and optionally includes one or more error detection or error correction bits stored along with the data bits) in main memory 110 or in other parts of the memory system 100. The bits of the physical address 300 are divided into three portions: a first portion 302, a second portion 304, and a third portion 306. In some embodiments, the first portion 302 corresponds to a group of the most-significant address bits in the physical address 300, the third portion 306 corresponds to a group of the least-significant address bits in the physical address 300, and the second portion 304 corresponds to a group of address bits between the most-significant address bits and the least-significant address bits. In the example of the physical address 300 shown in FIG. 3A, the first portion 302 includes the 14 most-significant address bits (i.e., bits 43:30), the third portion 306 includes the six least-significant address bits (i.e., bits 5:0), and the second portion includes 24 address bits of intermediate significance (i.e., bits 29:6). The first, second, and third portions 302, 304, and 306 are sometimes referred to respectively as a tag, a line index, and a block offset. In some embodiments, however, the first and second portions 302 and 304 are used differently than tags and line indices in conventional cache memories. The allocation of bits between the first, second, and third portions 302, 304, and 306 shown in FIG. 3A is merely an example of a possible allocation; in general, the number of bits allocated to each portion can vary. The total number of bits in the physical address 300 also can vary, depending for example on the total information storage capacity of the corresponding memory system. More generally, the first, second, and third portions can be any three distinct groups of bits in a physical address.

Figure 3B:
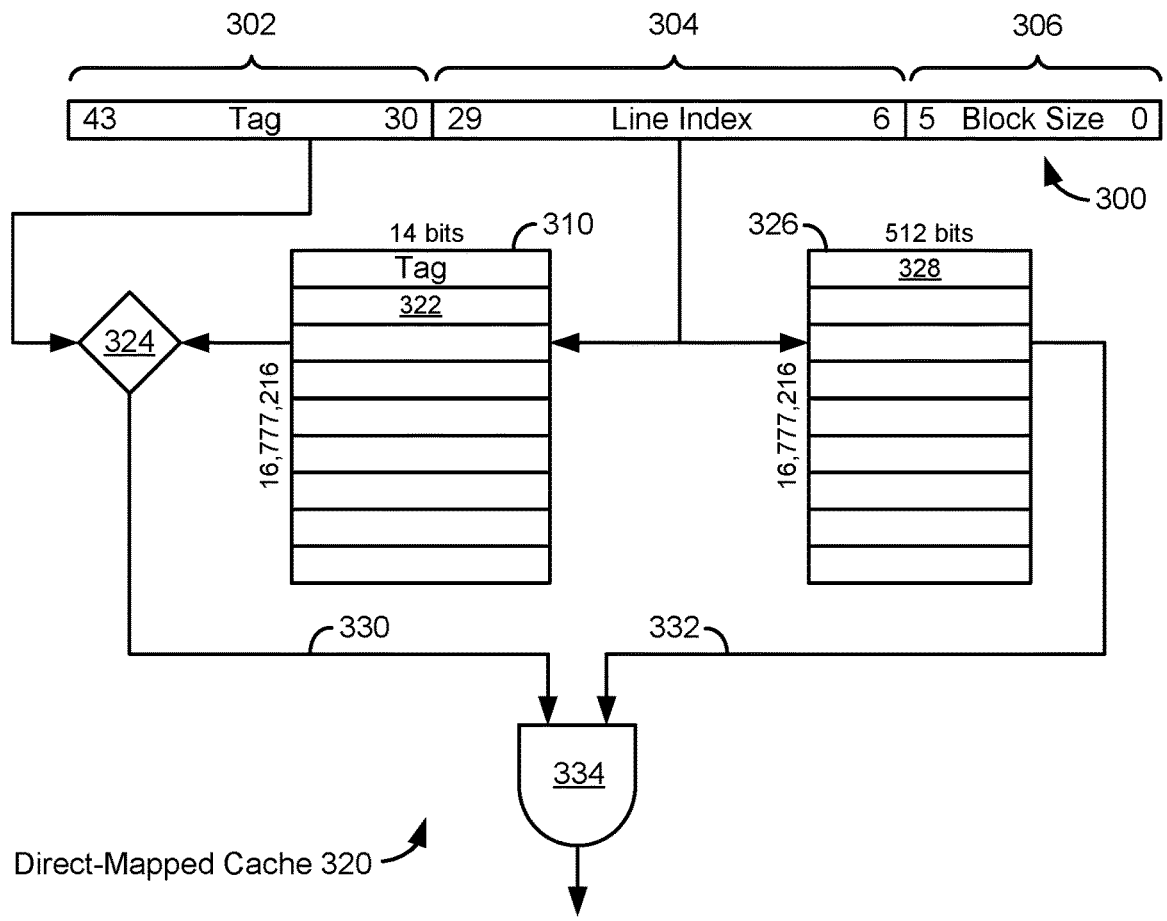
FIG. 3B illustrates a direct-mapped cache memory with tag storage.

FIG. 3B illustrates a direct-mapped cache memory 320. The cache 320 includes a cache line array 326 that includes a set of cache lines 328. For ease of reference, the cache line array 326 and the set of cache lines 328 are typically treated as being one and the same, and therefore both are identified by reference number 326. Each cache line 328 stores a block of information, the size of which corresponds to the third portion 306 of the physical address 300. In the example of FIG. 3B, each cache line 328 stores a block of 64 8-bit words, for a total of 512 bits. The six bits of the third portion 306 specify a particular one of the 64 words and thus may be used by a processor (e.g., processor(s) 102, FIG. 1) or memory controller (e.g., the memory controller 206, FIG. 2A) to extract the specified word from the block of information in a cache line 328 of cache 320. The cache lines 328 in the cache line array 326 are indexed by the second portions 304 of the corresponding physical addresses, such that the second portion 304 of a particular physical address 300 corresponds to the address of a corresponding cache line 328 in which information associated with the particular physical address 300 is stored, or is to be stored (if the information has not yet been stored in cache 320. Information associated with a particular physical address 300 thus is only stored in the cache line 328 indexed by the second portion 304 of the particular physical address 300, which is why the cache 320 is referred to as a direct-mapped cache.

The cache 320 also includes a table 310 that stores the first portions 302, or tags, of the physical addresses 300 of information stored in the cache lines 328. Table 310 includes a plurality of table entries 322, each of which stores a tag 302. The table entries 322, like the cache lines 328, are indexed by the second portions 304, such that the second portion 304 of a particular physical address 300 is the address of a corresponding table entry 322 that stores the first portion 302 of the particular physical address 300. When a block of information is written to the cache line 328 indexed by a second portion 304 (e.g., the second portion 304 shared by the physical addresses 300 of the words in the block of information), the corresponding first portion 302 (e.g., the first portion 302 shared by the physical addresses 300 of the words in the block of information) is written to the entry 322 indexed by the second portion 304.

When a processor (e.g., processor(s) 102, FIG. 1) or memory controller (e.g., controller 206, FIG. 2A) tries to fetch information associated with a specified physical address 300 from the cache 320, the second portion 304 of the specified physical address 300 is provided to cache line array 326 and table 310. The cache line 328 indexed by the second portion 304 is read and the information stored in it is transferred to circuitry 334 via a bus 332. The tag in the entry 322 indexed by the second portion 304 is read and provided to logic 324 (e.g., a comparator), which is also provided with the first portion 302 of the specified physical address 300. If the tag in the entry 322 matches the first portion 302 of the specified physical address 300, logic 324 generates a cache hit signal indicating that information associated with the specified physical address 300 is stored in the cache line 328 indexed by the second portion 304. The logic 324 provides the cache hit signal via a signal line 330 to circuitry 334, which forwards the information from the cache line 328 to the processor or memory controller in response. If the tag in the entry 322 does not match the first portion 302 of the specified physical address 300, logic 324 generates a signal (sometimes called a cache miss signal) indicating that information associated with the specified physical address 300 is not stored in the cache line 328 indexed by the second portion 304, and thus that a cache hit did not occur, and in response circuitry 334 does not forward the information from the cache line 328 to the processor or memory controller. Alternatively, the information from the cache line 328 and the signal from the logic 324 are both forwarded to the processor or memory controller, regardless of whether a cache hit occurred.

In the example of FIG. 3B, the set of cache lines 328 in cache line array 326 has a total of 16,777,216 cache lines 328 (i.e., 224 cache lines 328, corresponding to the 24 bits of the second portion 304), each of which can store a block of 64 bytes, for a total information storage capacity of 1 gigabyte (GB). The cache 320 thus can store one gigabyte (1 GB) of information. The table 310 has a total of 16,777,216 entries 322 (i.e., 224 entries 322, corresponding to the 24 bits of the second portion 304), each of which can store a 14-bit tag corresponding to the 14 bits of the first portion 302, for a total tag storage of 28 megabytes (MB). The overhead associated with tag storage in the cache 320 thus is 2.8% (=29 MB/1 GB) of the information storage capacity of the cache 320, which is not insubstantial.

For a fixed information storage capacity, the overhead associated with tag storage increases with the degree of set associativity. For example, a two-way set associative cache memory with the same information storage capacity as the direct-mapped cache 320 could be implemented by adding a second cache line array 326, storing a second set of cache lines 328, and a corresponding second table 310, second logic 324, and second circuitry 334. Bit 29 of the physical address 300 would become the least-significant bit of the first portion 302 instead of the most-significant bit of the second portion 304. The cache lines 328 of each of the two cache line arrays 326 would be indexed by the 23-bit second portions 304, resulting in two distinct sets of 8,388,608 (i.e., 223) cache lines 328, giving a total of 1 GB of information storage in the cache lines 328, as in the direct-mapped cache 320. The entries 322 of each of the two tables 310 would also be indexed by the 23-bit second portions 304 and would each store a 15-bit tag instead of the 14-bit tag in the direct-mapped cache 320, since bit 29 would be included in the first portions 302 instead of the second portions 304 of physical addresses 300. As a result, the overhead associated with tag storage in this hypothetical 1 GB two-way set associative cache would be 30 MB, or 3% of the information storage capacity, as compared to 28 MB of tag storage overhead, or 2.8% of the information storage capacity, in the direct-mapped cache 320.

Figure 4A:
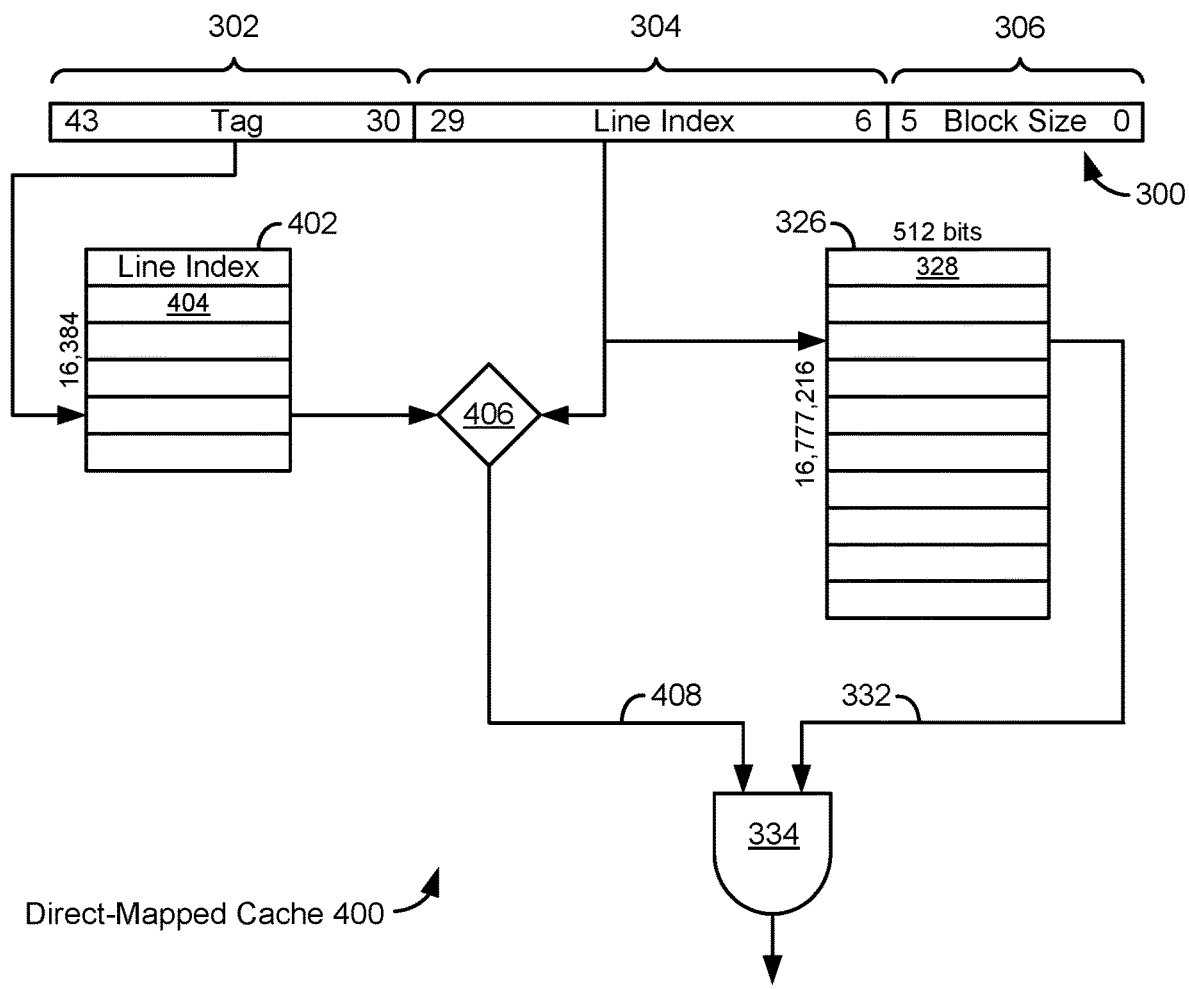
FIGS. 4A and 4B illustrate direct-mapped cache memories in accordance with some embodiments.

To reduce the amount of memory in a cache that is not used for storing information, and thus is overhead, a cache memory architecture is implemented in which the cache lines are indexed by a different portion of the physical addresses 300 than the table(s) used in determining whether cache hits occur. FIG. 4A illustrates a direct-mapped cache 400 with an example of such an architecture, in accordance with some embodiments. Like the cache 320 (FIG. 3B), the cache 400 includes a cache line array 326 storing a set of cache lines 328 indexed by the second portions 304, with a total information storage capacity of 1 GB. Thus, in cache 400, the second portion 304 of a particular physical address 300 corresponds to the address of a corresponding cache line 328 in which information associated with the particular physical address 300 is to be stored. Cache 400 also includes a table 402 of entries 404 indexed not by the second portions 304, but by the first portions 302 of physical addresses 300. Instead of storing first portions 302, the entries 404 of the table 402 store indications of the second portions 304 of the physical addresses 300 of information stored in the cache lines 328. In some embodiments, each entry 404 stores an indication of a common second portion 304 of the physical addresses 300 associated with a block of information stored in a cache line 328. For example, the 24 bits that constitute the common second portion 304 of the physical addresses 300 associated with a block of information stored in a cache line 328 are stored in an entry 404 indexed by the common first portion 302. (The physical addresses 300 associated with any given block of information stored in a particular cache line 328 differ only in their third portions 306, and thus share common second portions 304 and common first portions 302.) For ease of reference, table 402 is sometimes called a line index table, the table entries 404 are sometimes called line index table entries, and the "indications of the second portions 304 of the physical addresses 300 of information stored in the cache lines 328" stored in table entries 404 are sometimes called line index values. It is noted that these are different from the tag array, tag entry and tag value, respectively, associated with the direct-mapped cache 320 shown in FIG. 3B. The architecture of the cache 400 thus is distinct from the architecture of the cache 320 (FIG. 3B).

In other embodiments, each table entry 404 is able to simultaneously store indications of multiple second portions 304 of physical address that share a common first portion 302, which indexes the entry 404. For example, in some embodiments table entries 404 are implemented as entries 520 (FIG. 5B), described below. Regardless, each stored indication (in a respective table entry 404) thus indicates whether a corresponding cache line 328 has been allocated to store information for a set of physical addresses with common first and second portions 302 and 304. When a block of information is written to a cache line 328 indexed by the common second portion 304 of the physical addresses 300 of the information in the block, an indication of the common second portion 304 is stored in the entry 404 indexed by the common first portion 302 of the physical addresses 300 of the information in the block.

When a processor (e.g., processor(s) 102, FIG. 1) or memory controller (e.g., controller 206, FIG. 2A) tries to fetch information associated with a specified physical address 300 from cache 400, the second portion 304 of the specified physical address 300 is provided to the cache line array 326. The cache line 328 indexed by the second portion 304 is read and the information stored in it is transferred to circuitry 334 via bus 332. An indication in the entry 404 indexed by the first portion 302 of the specified physical address 300 is provided to logic 406 (e.g., a comparator), which is also provided with the second portion 304 of the specified physical address 300. If the indication matches the second portion 304 of the specified physical address 300, logic 406 generates a signal (e.g., a cache hit signal) indicating that information associated with the specified physical address 300 is stored in the cache line 328 indexed by the second portion 304 of the specified physical address 300. Logic 406 provides the signal via a signal line 408 to circuitry 334, which forwards the information from the cache line 328 to the processor or memory controller in response. If the indication in the entry 404 does not match the second portion 304 of the specified physical address 300, logic 406 generates a signal (e.g., a cache miss signal) indicating that information associated with the specified physical address 300 is not stored in the cache line 328 indexed by the second portion 304, and thus that a cache hit did not occur, and in response circuitry 334 does not forward the information from the cache line 328 to the processor or memory controller. Alternatively, the information from the cache line 328 and the signal from the logic 406 are both forwarded to the processor or memory controller, regardless of whether a cache hit occurred.

Figure 4B:
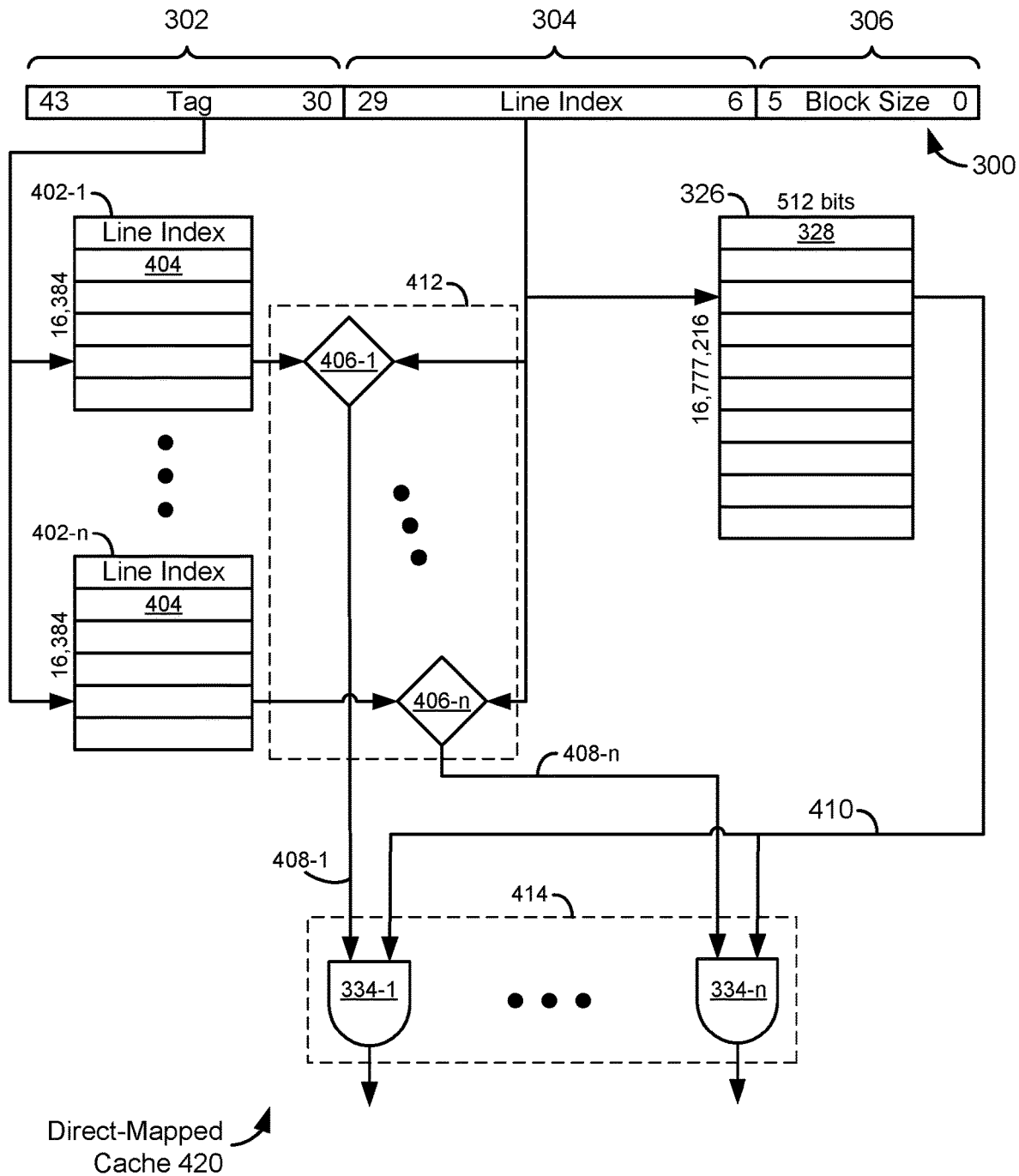

The number of entries 404 in the table 402 can limit the performance of the cache 400, by limiting the number of indications of second portions 304 that can be stored in the table 402. In some embodiments, to increase the number of indications that can be stored, multiple tables 402 are used. FIG. 4B illustrates a direct-mapped cache 420 that includes a plurality of tables 402-1 through 402-n in accordance with some embodiments, where n is an integer greater than one. For example, the direct-mapped cache 420 includes two, four, eight or 16 or more tables (i.e., n=2, 4, 8 or 16 or more). Each of the tables 402-1 through 402-$n$ is indexed by first portions 302 of physical addresses 300. For example, if the first portions 302 are 14 bits, as shown for the physical addresses 300, then each of the tables 402-1 through 402-$n$ includes 16,384 (=$2^{14}$, also sometimes written as 2^14) entries 404. In general, the number of entries 404 in each of the tables 402-1 through 402-$n$ varies based on the number of bits in the first portions 302 of the physical addresses. When a block of information is written to a cache line 328 indexed by the common second portion 304 of the physical addresses 300 of the information in the block, an indication of the common second portion 304 is stored in one of the tables 402-1 through 402-$n$, in an entry 404 indexed by the common first portion 302 of the physical addresses 300 of the information in the block.

The cache 420 also includes logic 412 to determine whether the second portion 304 of a specified physical address 300 matches an indication stored in a table entry 404 indexed by the first portion 302 of the specified physical address 300 in any of the one or more tables 402-1 through 402-$n$. When a processor (e.g., processor(s) 102, FIG. 1) or memory controller (e.g., controller 206, FIG. 2A) tries to fetch information associated with a specified physical address 300 from the cache 420, the logic 412 determines whether any of the tables 402-1 through 402-$n$ stores, in an entry 404 indexed by the first portion 302 of the specified physical address 300, an indication that matches the second portion 304 of the specified physical address 300. If one such entry 404 is determined to store an indication that matches the second portion 304 of the specified physical address 300, the logic 412 generates a signal indicating that a match occurred. In some embodiments, the signal is a cache hit signal indicating that a cache line 328 in cache line array 326 has been allocated to store a block of information associated with physical addresses that share the first and second portions 302 and 304 of the specified physical address 300. In some embodiments, the logic 412 provides the signal (e.g., the cache hit signal) to circuitry 414 coupled to the logic 412. Circuitry 414 receives the information from the cache line 328 indexed by the second portion 304 of the specified physical address 300 and conditionally forwards the information to the processor or memory controller in response to (and in accordance with the state or value of) the signal from the logic 412. In some embodiments, if no cache hit signal is received from the logic 412, indicating no match between the second portion 304 of the specified physical address 300 and the indications stored in the table entries 404 indexed by the first portion 302 of the specified physical address 300, circuitry 414 does not forward the information from the cache line 328 indexed by the second portion 304 of the specified physical address 300 to the processor or memory controller. Alternatively, the information from the cache line 328 and a signal from the logic 412 indicating whether or not a cache hit occurred are both forwarded to the processor or memory controller, regardless of whether a cache hit occurred.

In some embodiments, logic 412 includes multiple instances of logic 406 and circuitry 414 includes multiple instances of circuitry 334. Each of the tables 402-1 through 402-$n$ is coupled to a respective instance of logic 406 (e.g., table 402-1 is coupled to logic 406-1 and table 402-$n$ is coupled to logic 406-$n$). The instances of the logic 406 are implemented, for example, as comparators. Each instance of the logic 406 is coupled to a respective instance of circuitry 334 (e.g., logic 406-1 is coupled to circuit 334-1 and logic 406-$n$ is coupled to circuit 334-$n$). Each instance of circuitry 334 is also coupled to cache line array 326, to receive information stored in a cache line 328 indexed by a second portion 304 of a specified physical address 300 provided by a processor or memory controller during a fetch operation. If a respective instance of circuitry 334 receives, from the respective instance of the logic 406 to which it is coupled, a signal (e.g., a cache hit signal) indicating a match, it forwards the information from the cache line 328 to the processor or memory controller, and otherwise does not forward the information.

When a new block of information associated with a set of physical addresses 300 with common first and second portions 302 and 304 is stored in a cache line 328 indexed by the common second portion 304, an indication of the common second portion 304 is stored in an entry 404 in one of the tables 402-1 through 402-$n$. The entry 404 is indexed by the common first portion 302. The table 402 in which the indication is stored is chosen in accordance with a pre-defined policy. In some embodiments, the table 402 in which the indication is stored is chosen at random from among the tables 402-1 through 402-$n$. In other embodiments, the table 402 in which the indication is stored is chosen using a "least recently used" (LRU) algorithm. To choose a table using the LRU algorithm, the indication stored in the entry 404 indexed by the common first portion 302 is identified for each of tables 402-1 through 402-$n$. The resulting n indications correspond to n respective blocks of information stored in n respective cache lines 328 indexed by the n second portions 304 corresponding to the n indications. The least-recently-used block of the n blocks is identified, and the table 402 storing the indication of the second portion 304 that indexes the least-recently-used block is chosen (e.g., the indication of the second portion 304 that indexes the least-recently-used block is overwritten with an indication of the common second portion 304 of the physical addresses 300 associated with the new block of information). In yet other embodiments, a first-in, first-out (FIFO) algorithm is used, in which the oldest of the n blocks is identified and the table 402 storing the indication of the second portion 304 that indexes the oldest block is chosen. The oldest of the n blocks is the first of the n blocks to have been stored in the cache 420. Random assignment, the LRU algorithm, and the FIFO algorithm are thus examples of policies used to choose the table 402 in which the indication is stored.

In some embodiments, a single table entry 404 can store indications of multiple second portions 304. Because the single entry 404 is indexed by a first portion 302, the single entry 404 thus can store a set of indications corresponding to a plurality of physical addresses 300 that share a common first portion 302 but have varying second portions 304. Each indication in the set indicates whether a corresponding cache line 328 has been allocated to store information (e.g., a block of information) associated with a set of physical addresses sharing the common first portion 302 and a common second portion 304 corresponding to the respective indication.

Figure 5A:
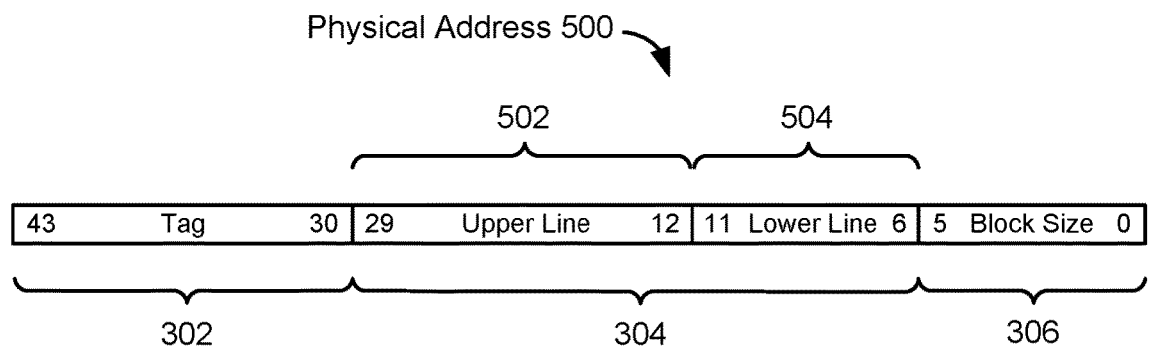
FIG. 5A illustrates a physical address in which a portion of the address has been divided into first and second sub-portions in accordance with some embodiments.

To implement storage of indications of multiple second portions 304 in a single table entry 404, for example, the second portions 304 of physical addresses 300 are divided into first and second sub-portions. FIG. 5A illustrates a physical address 500, which is an example of a physical address 300 in which the second portion 304 has been divided into a first sub-portion 502 and a second sub-portion 504 in accordance with some embodiments. The first sub-portion 502 is referred to as the upper line index or upper line and the second sub-portion 504 is referred to as the lower line index or lower line. In the example of FIG. 5A, the first sub-portion 502 is the most-significant sub-portion of the portion 304 and includes 18 bits (i.e., bits 29:12), while the second sub-portion 504 is the least-significant sub-portion of the portion 304 and includes 6 bits (i.e., bits 11:6). This is merely an example of a possible allocation of bits between the first and second sub-portions 502 and 504. Other allocations of bits between the first and second sub-portions 502 and 504 are used in other embodiments.

Figure 5B:
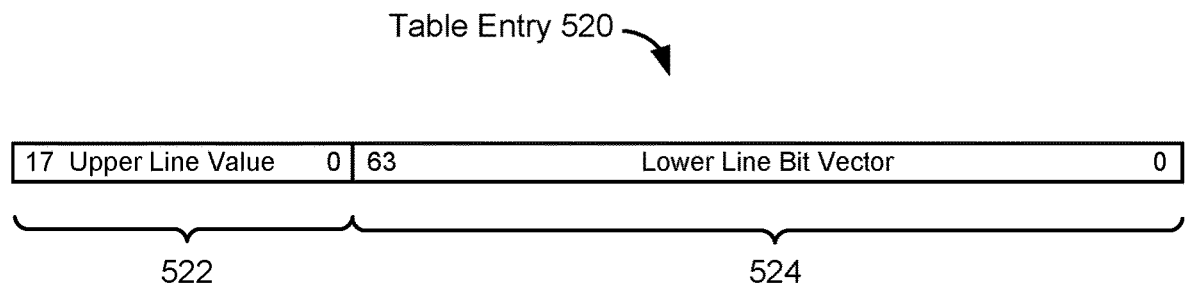
FIG. 5B illustrates a table entry that can store indications of portions of multiple addresses in accordance with some embodiments.

FIG. 5B illustrates a table entry 520 that can store indications of multiple second portions 304 that share a common first sub-portion 502 but have different second sub-portions 504 in accordance with some embodiments. The table entry 520 is an example of an entry 404 (FIGS. 4A-4B). In some embodiments, all or a portion of the entries 404 of the one or more tables 402-1 through 402-n (FIG. 4B) are implemented as table entries 520. The table entry 520 has first and second portions 522 and 524, comprising first and second sets of memory cells. For case of explanation, the memory cells and the values stored in those memory cells are referenced by the same reference numbers. The first set of memory cells 522 stores the common first sub-portion 502. In the example of FIGS. 5A-5B, the first sub-portion 502 includes 18 bits and the first set of memory cells 522 thus includes 18 memory cells to store the 18 bits. The second set of memory cells 524 stores a bit vector (the "lower line bit vector"). The bit vector 524 includes a number of bits equal to two raised to the power of the number of bits in the second sub-portion 504. In the example of FIGS. 5A-5B, the second sub-portion 504 includes 6 bits and the bit vector 524 thus includes memory cells to store 64 bits (64-26). In some embodiments, the memory cells of the first 522 and/or second 524 portions of the table entries 520 are multi-level cells that store multiple bits per cell.

Each bit in the bit vector 524 corresponds to one of the possible values of the second sub-portion 504, and is sometimes called an indication flag. For example, bit 0 (indication flag 0) of the bit vector 524 corresponds to a value of 000000 for the second sub-portion 504, and bit 63 of the bit vector 524 corresponds to a value of 111111 for the second sub-portion 504. Each bit thus can provide an indication of a distinct second sub-portion 504 when set to a specified value (e.g., logical-1 or logical-0), and the bit vector 524 can simultaneously provide indications of up to 64 distinct second sub-portions 504. For example, setting bit 0 of the bit vector 524 to "1" provides an indication of a second sub-portion 504 of 000000 (i.e., 0x00). Simultaneously setting bit 63 of the bit vector 524 to "1" simultaneously provides an indication of a second sub-portion 504 of 111111 (i.e., 0x7F). In this example, a table entry 520 that stores a common first sub-portion 502 in the first set of memory cells 522 and has bits 63 and 0 of the bit vector 524 simultaneously set to "1," with all other bits of the bit vector 524 set to "0," simultaneously provides an indication of two second portions 304: (1) a second portion 304 equal to the combination of the common first sub-portion 502 and a second sub-portion 504 of 111111, and (2) a second portion 304 equal to the combination of the common first sub-portion 502 and a second sub-portion 504 of 000000. A table entry 520 that stores a common first sub-portion 502 in the first set of memory cells 522 and simultaneously has all 64 bits of the bit vector 524 set (e.g., to "1") simultaneously provides indications of all 64 second portions 304 that share the common first sub-portion 502.

Figure 6A:
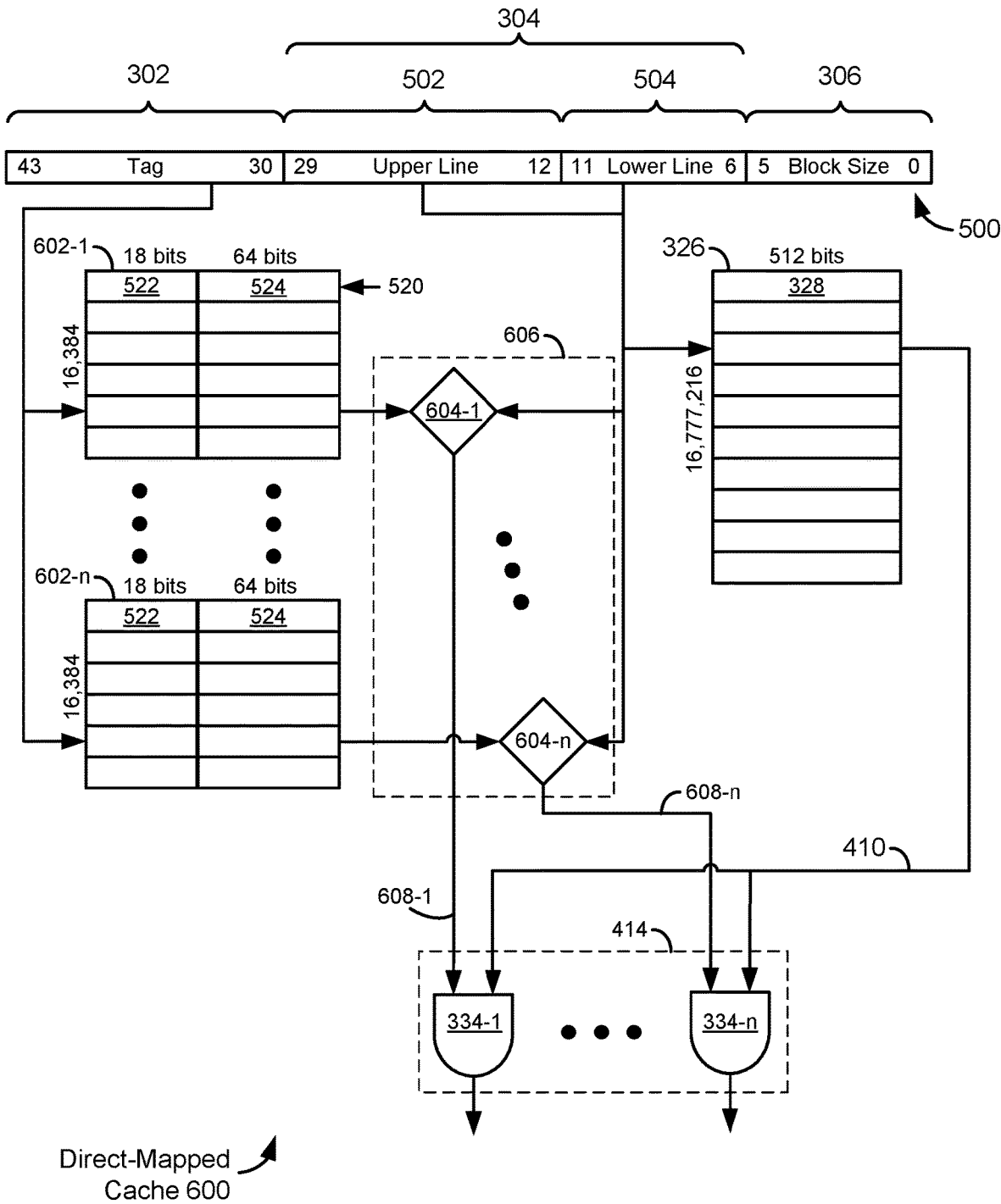
FIGS. 6A-6C illustrate cache memories in accordance with some embodiments.

FIG. 6A illustrates a direct-mapped cache 600 in which a plurality of tables 602-1 through 602-n (e.g., 2, 4, 8 or 16 or more tables) each include entries 520 (FIG. 5B) indexed by the first portions 302 of physical addresses 500 (FIG. 5A). The cache 600 is an example of the direct-mapped cache 420 (FIG. 4B) and the plurality of tables 602-1 through 602-n is an example of the plurality of tables 402-1 through 402-n. The cache 600 includes logic 606 to determine whether the second portion 304 of a specified physical address 500 matches an indication stored in a table entry 520 indexed by the first portion 302. For example, logic 606 includes logic 604 (e.g., a comparator) coupled to each table 602 (e.g., logic 604-1 coupled to the table 602-1 and logic 604-n coupled to the table 604-n). The logic 604 compares the first sub-portion 502 of the specified physical address 500 to the value stored in the first set of memory cells 522 of the table entry 520, and thus determines whether the first set of memory cells 522 provides an indication of the first sub-portion 502 of the specified physical address 500. The logic 604 also checks whether the bit that corresponds to the second sub-portion 504 of the specified physical address 500 in the bit vector 524 of the table entry 520 has been set (e.g., whether the bit stores a "1"), and thus determines whether the bit vector 524 provides an indication of the second sub-portion 504 of the specified physical address 500. If the first set of memory cells 522 and the bit vector 524 both provide respective indications of the first and second sub-groups 502 and 504 of the specified physical address, and thus together provide an indication of the second portion 304 of the specified physical address 500, then the logic 604 generates a signal (e.g., a cache hit signal) indicating that a cache line 328 in cache line array 326 has been allocated to store information associated with the specified physical address 500 (and, in some embodiments, information associated with other physical addresses that share the first and second portions 302 and 304 of the specified physical address 500). This signal is provided to the circuitry 414, which functions as described with regard to FIG. 4B, or alternatively is provided to the processor or memory controller that provided the specified physical address 500. The logic 604-1 through 604-n and 606 are respective examples of the logic 406-1 through 406-n and 412 (FIG. 4B).

When a new block of information associated with a set of physical addresses 500 with common first and second portions 302 and 304 is stored in a cache line 328 indexed by the common second portion 304 in the cache 600, an indication of the common second portion 304 is stored in an entry 520 in one of the tables 602-1 through 602-n. The entries 520 indexed by the common first portion 302 in the tables 602-1 through 602-n are checked to determine whether one of them stores the first sub-portion 502 of the common second portion 304 in its first set of bits 522. If one of them does, then the bit that corresponds to the second sub-portion 504 in the bit vector 524 of that entry 520 is set to provide an indication of the second sub-portion 504. Otherwise, the first sub-portion 502 of the common second portion 304 is stored in the first set of bits 522 of one of the entries 520 indexed by the common first portion 302, and the bit of that entry's bit vector 524 that corresponds to the second sub-portion 504 of the common second portion 304 is set to provide an indication of the second sub-portion 504 of the common second portion 304.

In an example in which the cache 600 includes 16 tables 602-1 through 602-16, the 16 tables occupy a total of approximately 2.56 MB of storage ($16 \times 2^{14} \times 82$ bits/(8 bits/byte$\times$220)=2.5625 MB), or 0.26% of the 1 GB information storage capacity of the cache 600. This 0.26% overhead is an order of magnitude lower than the 2.8% overhead for cache 320 (FIG. 3B), which corresponds to significant savings in die area.

Figure 6B:
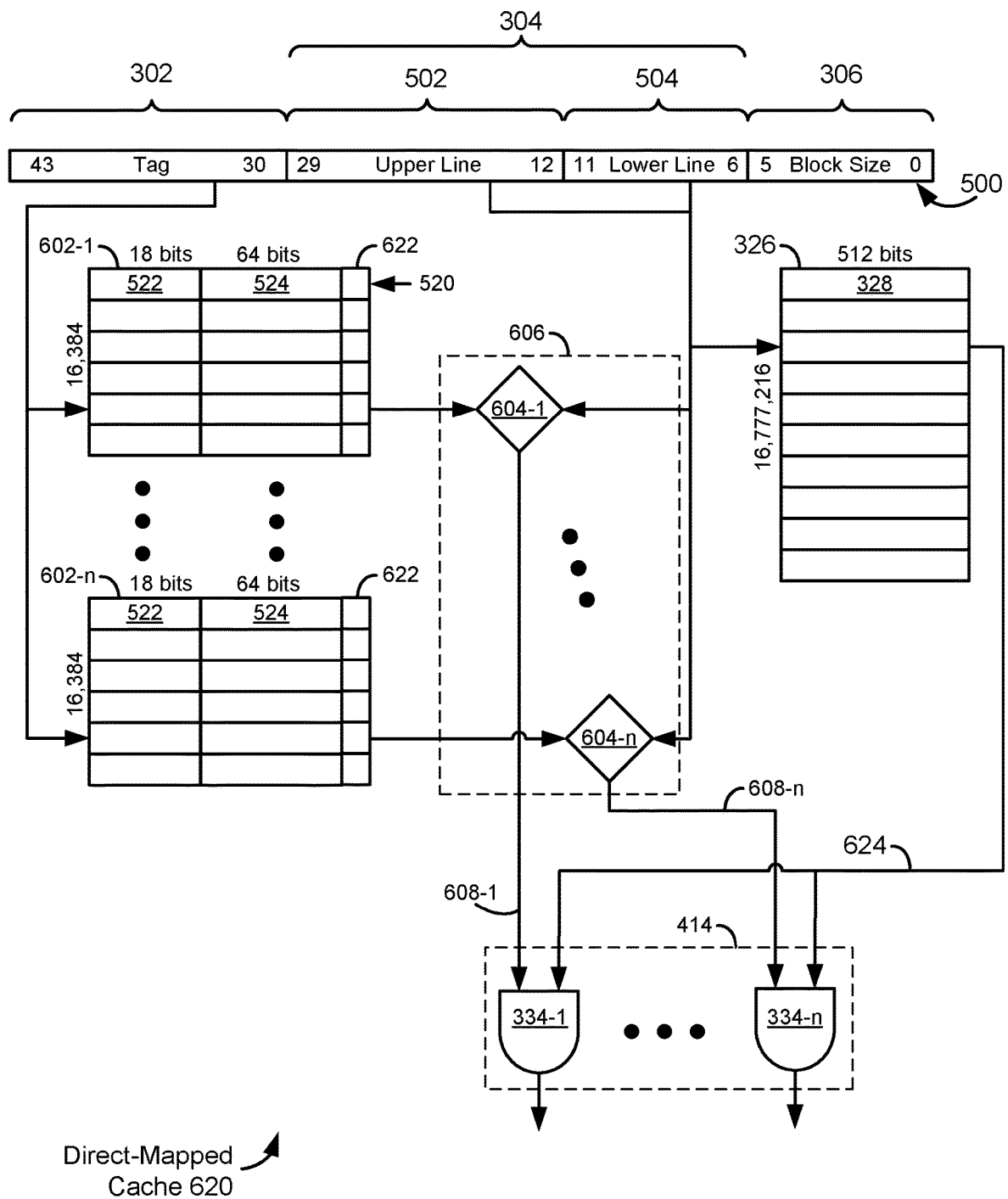
Figure 6C:
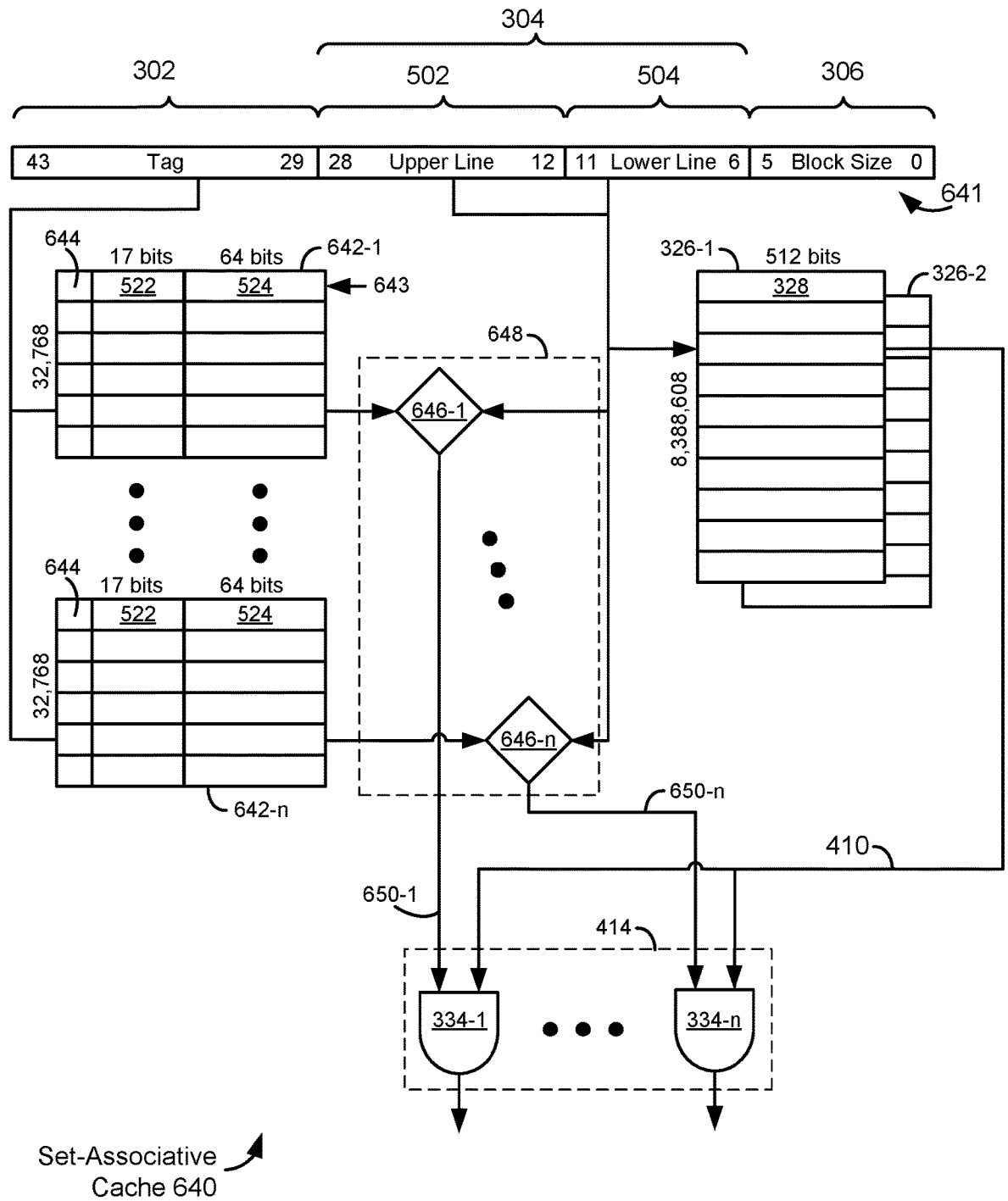

In some embodiments, a valid bit is associated with a respective entry 520. FIG. 6B illustrates a direct-mapped cache 620 in which a respective valid bit 622 is associated with each entry 520 in each of the tables 602-1 through 602-n, in accordance with some embodiments. For example, the valid bit 622 is stored in an additional memory cell associated with the memory cells of the entry 520. In some embodiments, a cache hit signal is generated in accordance with both the output of the logic 606 (or alternatively, the logic circuit 406, FIG. 4A, or the logic 412, FIG. 4B) and the status of the valid bit 622: a cache hit signal is generated only if (A) the logic 606 indicates that an entry 520 (or alternatively, an entry 404, FIGS. 4A-4B) indexed by the first portion 302 of a specified physical address 500 (or 300) provides an indication of the second portion 304 of the specified physical address 500 and (B) the valid bit 622 of the entry 520 (or alternatively, an entry 404, FIGS. 4A-4B) indexed by the second portion 304 of the specified physical address 500 is set valid. Alternatively, a respective valid bit 622 is associated with each cache line 328 in the cache line array 326.

In some embodiments, each cache line 328 in cache line array 326 also includes a dirty bit, to indicate whether the cache line 328 stores modified data.

In some embodiments, valid bits are associated with respective table entries 404 or 520. In some embodiments, one or more other bits are associated with respective cache lines 328 (e.g., a dirty bit to indicate whether the block of information in the cache line 328 has been modified and thus is to be written back to main memory 110 (FIG. 1)).

In some embodiments, cache lines are divided into multiple sets and a particular block of information can be stored in a corresponding cache line in any one of the multiple sets, resulting in a set-associative cache memory. For example, each set of cache lines corresponds to a different memory array 326. FIG. 6C illustrates a two-way set-associative cache memory 640 in which the cache lines 328 are divided into a first set (in cache line array 326-1) and a second set (in cache line array 326-2). For the cache memory 640, the most-significant bit of the second portion 304 of the physical address 500 (i.e., bit 29) has been reallocated to the first portion 302, resulting in a physical address 641 in which the first portion 302 has 15 bits and the second portion 304 has 23 bits, as opposed to the respective 14 bits and 24 bits of the first portion 302 and the second portion 304 of the physical address 500 (FIGS. 5A, 6A-6B).

In cache 640, the cache lines 328 in each of the cache line arrays 326-1 and 326-2 are indexed by the 23-bit second portion 304 of the physical address 641, giving a total of 8,388,608 (i.e., 223) cache lines 328 in each of the two cache line arrays 326-1 and 326-2. The total information storage capacity of the cache lines 328 in the cache 640 thus equals 1 GB, the same as for cache 400 (FIG. 4A), 420 (FIG. 4B), cache 600 (FIG. 6A), and cache 620 (FIG. 6B), described above. A block of information associated with a set of physical addresses 641 that share common first and second portions 302 and 304 can be stored in the cache line 328 indexed by the common second portion 304 in either of the two cache line arrays 326-1 and 326-2.

Cache 640 includes tables 642-1 through 642-n, each of which includes entries 643 indexed by the 15-bit first portion 302 of physical addresses 641, giving a total of 32,748 (i.e., 215) entries 643 in each of the tables 642-1 through 642-n. In some embodiments, each entry 643 includes a first set of memory cells 522 (FIG. 5B) and a bit vector 524 (FIG. 5B). In addition, each entry 643 stores a cache array selector value 644 (e.g., one bit, when there are two set associative cache line arrays 326, stored in an additional memory cell of the entry 643), the value of which specifies one of the cache line arrays 326 (e.g., a value of "0" corresponds to cache line array 326-1 and a value of "1" corresponds to cache line array 326-2, or vice-versa). It is noted that cache array selector value 644 does store or represent any of the address bits of a respective physical address, and instead is supplemental information stored in each table entry 643. In some embodiments, tables 644 are implemented as a combination of entries 404 (FIGS. 4A-4B) and cache array selector values 644.

When a block of information is written to a cache line 328 indexed by a second portion 304 of the physical addresses associated with the block of information, and an indication of the second portion 304 is stored in an entry 643, a value 644 is stored in the entry 643 to identify whether the block of information was stored in the first cache line array 326-1, or the second cache line array 326-2. When a specified physical address 641 is provided to the cache 640 during a fetch operation, the logic 648 (which includes, for example, a plurality of logic circuits (e.g., comparators) 646-1 through 646-n) compares the second portion 304 of the specified physical address 641 to indications stored in entries 643 indexed by the first portion 302 of the specified physical address 641. If a match is found for one of the entries 643, a signal indicating the match is forwarded to the circuitry 414 on a signal line 608, along with the value 644 from the matching entry 643. The circuitry 414 uses the value 644 to select one of the cache line arrays 326, such that the information on a cache line 328 in the selected cache line array 326 (specifically, the cache line 328 indexed by the second portion 304 of the specified physical address 641) is forwarded to the processor or memory controller that initiated the fetch.

In some embodiments, the cache array selector values 644 are omitted from the entries 643. Instead, respective tables 642 are allocated to respective cache lines arrays 326. For example, a first table 642-1 corresponds to the first cache line array 326-1, and a second table 642-2 corresponds to the second cache line array 326-2. If an entry 643 in a table 642 is determined to provide an indication of the second portion 304 of a specified physical address 641, then the cache line array 326 to which that table 642 is allocated is selected, and the information stored in the appropriate cache line 328 of that cache line array 326 (specifically, the cache line 328 indexed by the first portion 302 of the specified physical address 641) is provided to the processor or memory controller that specified the physical address 641.

The cache 640 is shown as a two-way set-associative cache. A similar cache with a greater degree of set-associativity is implemented by re-allocating additional bits from the second portion 304 to the first portion 302, adding additional sets of cache lines 328 (in additional cache line arrays 326), and in some embodiments, allocating additional bits in each table entry 643 to store a multi-bit cache array selector value 644 having a sufficient number of bits to identify the cache line array 326 corresponding to the entry 643. For example, in a four-way set associative cache that includes a cache array selector value 644 in the table entries 643, each cache array selector value 644 would have two bits.

Caches 400 (FIG. 4A), 420 (FIG. 4B), 600 (FIG. 6A), 620 (FIG. 6B), and 640 (FIG. 6C) are described as implemented for physical addresses 300, 500, and 641, which have 44 bits allocated between portions 302, 304, and 306, and sub-portions 502 and 504, as shown. Similar caches may be implemented for physical addresses of other sizes and/or with other allocations of bits between the portions 302, 304, and 306, and sub-portions 502 and 504.

Figure 7A:
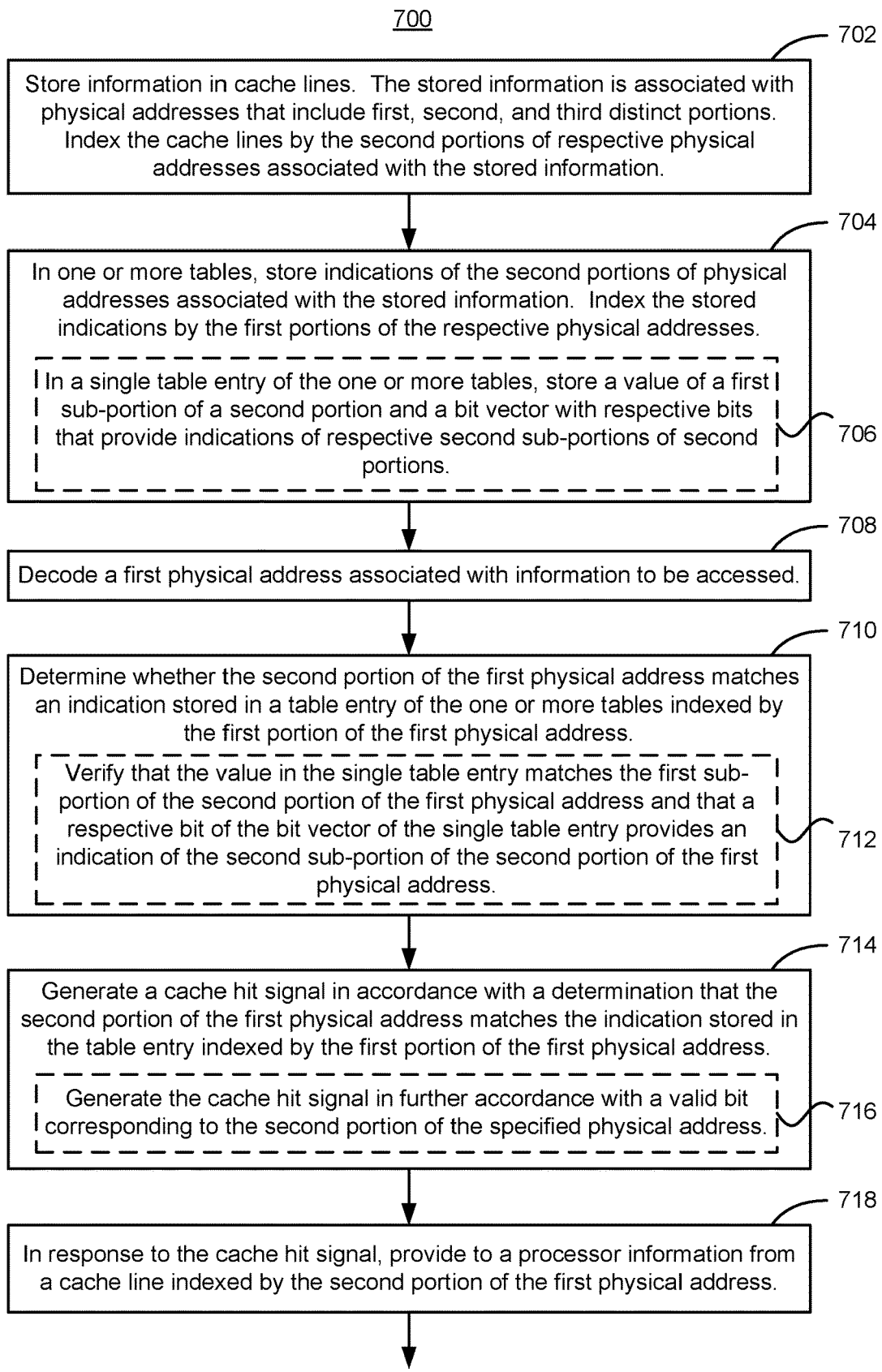
FIGS. 7A-7C are flow diagrams illustrating methods of operating a cache memory in accordance with some embodiments.

Attention is now directed to methods of operating a cache memory. FIG. 7A is a flow diagram illustrating a method 700 of operating a cache memory (e.g., a cache 400 (FIG. 4A), 420 (FIG. 4B), 600 (FIG. 6A), 620 (FIG. 6B), or 640 (FIG. 6C)) in accordance with some embodiments. In method 700, information is stored (702) in cache lines. For example, blocks of information are stored in cache lines 328 (FIGS. 4A-4B, 6A-6C). The stored information is associated with physical addresses (e.g., physical addresses 300 (FIGS. 3A, 4A-4B), 500 (FIGS. 5A, 6A-6B), or 641 (FIG. 6C)) that include first, second, and third distinct portions (e.g., first portions 302, second portions 304, and third portions 306). The cache lines 328 are indexed by the second portions of respective physical addresses associated with the stored information.

Indications of the second portions of physical addresses associated with the stored information are stored (704) in one or more tables (e.g., table 402 (FIG. 4A), tables 402-1 through 402-*n* (FIG. 4B), tables 602-1 through 602-*n* (FIGS. 6A-6B), or tables 642-1 through 642-*n* (FIG. 6C)). The stored indications are indexed by the first portions of the respective physical addresses.

In some embodiments, a single table entry of the one or more tables stores (706) a value of a first sub-portion of a second portion and also stores a bit vector with respective bits that provide indications of respective second sub-portions of second portions. For example, table entries 520 in the tables 602-1 through 602-*n* (FIGS. 6A-6B) each include a first portion 522, which stores a value of a first sub-portion 502, and a bit vector 524 to provide indications of respective second sub-portions 504. Each bit in the bit vector 524 provides an indication of a distinct second sub-portion 504 when the bit is set. Stated another way, in the bit vector 524 of a table entry 520, each indication flag that is set indicates that a cache line 528 in a cache line array 326 has been allocated to store data for a block of addresses corresponding to the address sub-portion 502 stored in the first portion 522 of the table entry and the address sub-portion 504 corresponding the indication flag. The shared upper bits of the block of addresses correspond to the position of the table entry 520 in the table 602.

A first physical address associated with information to be accessed is decoded (708). For example, a processor (e.g., processor(s) 102, FIG. 1) or memory controller (e.g., memory controller 206, FIG. 2A) decodes the first physical address from a memory reference in an instruction. A determination is made (710) as to whether the second portion of the first physical address matches an indication stored in a table entry of the one or more tables indexed by the first portion of the first physical address. For example, logic 406 (FIG. 4A), 412 (FIG. 4B), 606 (FIGS. 6A-6B), or 648 (FIG. 6C) makes this determination.

In some embodiments, the determination 710 includes verifying (712) that the value of the first sub-portion in the single table entry (e.g., as stored in the first set of memory cells 522, FIGS. 6A-6C) matches the first sub-portion of the second portion of the first physical address and that a respective bit of the bit vector (e.g., the bit vector 524, FIGS. 6A-6C) of the single table entry provides an indication of the second sub-portion of the second portion of the first physical address. For example, the logic 606 (FIGS. 6A-6B), or 648 (FIG. 6C) performs this verification.

A cache hit signal is generated (714) in accordance with a determination that the second portion of the first physical address matches the indication stored in the table entry indexed by the first portion of the first physical address. The cache hit signal is generated, for example, by the logic 406 (FIG. 4A), 412 (FIG. 4B), 606 (FIGS. 6A-6B), or 648 (FIG. 6C). In some embodiments, the cache hit signal is generated (716) in further accordance with a valid bit (e.g., valid bit 622, FIG. 6B) corresponding to the second portion of the specified physical address, and/or in accordance with one or more other bits corresponding to one or more portions of the specified physical address. For example, the cache hit signal is generated based on a signal from logic 406 (FIG. 4A), 412 (FIG. 4B), 606 (FIGS. 6A-6B), or 648 (FIG. 6C) and the value of a corresponding valid bit as provided to the circuitry 334 (FIG. 4A) or 414 (FIGS. 4B, 6A-6C).

Of course, a cache hit signal is not generated if the second portion of the first physical address does not match the indication stored in the table entry indexed by the first portion of the physical address. In that case, a cache miss signal is typically generated and provided to cache management logic (not shown), which performs a sequence of actions to resolve the cache miss. One embodiment of that sequence of actions is described below with reference to FIG. 7B. Typically, in response to a cache miss, the cache memory allocates a cache line 328 in the cache the device for the specified physical address and stores data in the allocated cache line data for the specified physical address, if such data is stored at a higher level of the memory system.

In response to the cache hit signal, a processor (e.g., processor(s) 102, FIG. 1) is provided (718) with information from a cache line indexed by the second portion of the first physical address. In some embodiments, the information is provided to the processor via a memory controller (e.g., the memory controller 206, FIG. 2A)

While method 700 includes a number of operations that appear to occur in a specific order, it should be apparent that method 700 can include more or fewer operations, which can be executed serially or in parallel. An order of two or more operations may be changed and two or more operations may be combined into a single operation.

Figure 7B:
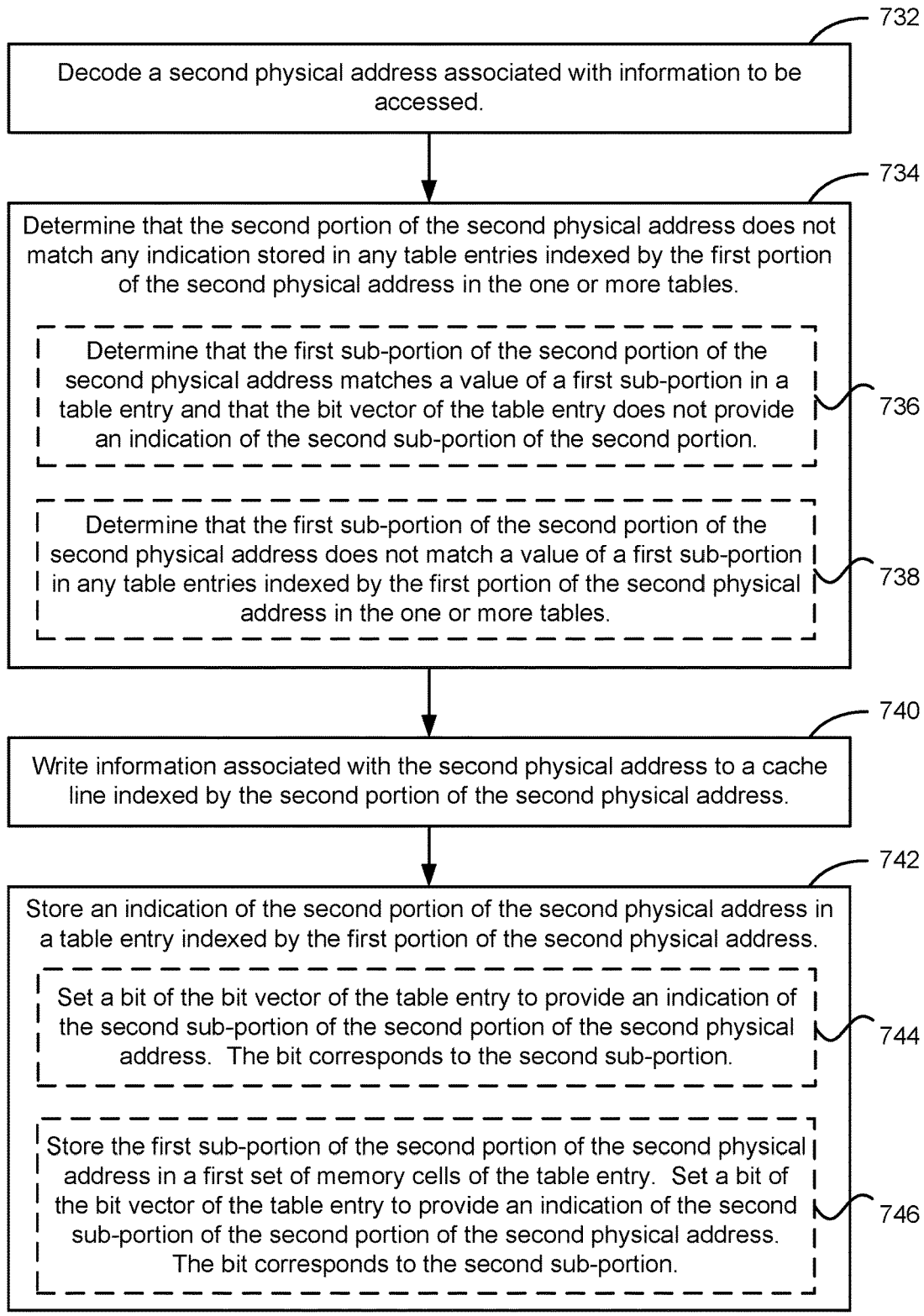

FIG. 7B is a flow diagram illustrating a method 730 of operating a cache memory (e.g., a cache 400 (FIG. 4A), 420 (FIG. 4B), 600 (FIG. 6A), 620 (FIG. 6B), or 640 (FIG. 6C)) in accordance with some embodiments. In some embodiments, method 730 is performed in conjunction with method 700 (FIG. 7A).

In method 730, a second physical address associated with information to be accessed is decoded (732). For example, a processor (e.g., processor(s) 102, FIG. 1) or memory controller (e.g., memory controller 206, FIG. 2A) decodes the second physical address from a memory reference in an instruction. A determination is made (734) that the second portion of the second physical address does not match any indication stored in the table entries indexed by the first portion of the second physical address in the one or more tables (e.g., table 402 (FIG. 4A), tables 402-1 through 402-*n* (FIG. 4B), tables 602-1 through 602-*n* (FIGS. 6A-6B), tables 642-1 through 642-*n* (FIG. 6C)). For example, the logic 406 (FIG. 4A), 412 (FIG. 4B), 606 (FIGS. 6A-6B), or 648 (FIG. 6C) makes this determination. Optionally, a cache miss signal is generated when the determination (734) is made.

In response to the cache miss signal or the determination (734), information associated with the second physical address is written (740) to a cache line (e.g., a cache line 328, FIGS. 4A-4B, 6A-6C) indexed by the second portion of the second physical address. Furthermore, an indication of the second portion of the second physical address is stored (742) in a table entry (e.g., a table entry 404 (FIGS. 4A-4B), 520 (FIGS. 6A-6B), or 643 (FIG. 6C)) indexed by the first portion of the second physical address. In some embodiments, writing information associated with the second physical address to a cache line includes allocating a cache line in the memory array to the second physical address. If the only cache line(s) suitable for allocation to the second physical address is(are) already allocated to another physical address, a currently stored cache line is evicted to make room for the new cache line. See discussion of operations 780-784, below.

In some embodiments, the cache miss determination operation 734 includes determining (736) that the first sub-portion (e.g., 502, FIGS. 6A-6C) of the second portion of the second physical address matches a value of a first sub-portion in a table entry (e.g., as stored in the first set of memory cells 522, FIGS. 6A-6C) and that the bit vector (e.g., 524, FIGS. 6A-6C) of the table entry does not provide an indication of the second sub-portion (e.g., 504, FIGS. 6A-6C) of the second portion. In response, the operation 742 includes setting (744) a bit of the bit vector of the table entry to provide an indication of the second sub-portion of the second portion of the second physical address. The bit corresponds to the second sub-portion.

In some embodiments, the cache miss determination operation 734 includes determining (738) that the first sub-portion (e.g., 502, FIGS. 6A-6C) of the second portion of the second physical address does not match a value of a first sub-portion in any table entries indexed by the first portion of the second physical address in the one or more tables. In response, the operation 742 includes storing (746) the first sub-portion of the second portion of the second physical address in a first set of memory cells (e.g., 522, FIGS. 6A-6C) of a table entry indexed by the first portion of the second physical address. In addition, a bit of the bit vector (e.g., 524, FIGS. 6A-6C) of the table entry is set to provide an indication of the second sub-portion (e.g., 504, FIGS. 6A-6C) of the second portion of the second physical address. The bit that is set corresponds to the second sub-portion.

Furthermore, in some embodiments, if the identified table entry to be used, in which the first sub-portion of the second portion of the second physical address is to be stored, currently stores indications of one or more other cache lines having physical addresses with a different first sub-portion, those one or more cache lines are evicted from the cache. Evicting cache lines from the cache is discussed below with reference to FIG. 7C.

While method 730 includes a number of operations that appear to occur in a specific order, it should be apparent that method 730 can include more or fewer operations, which can be executed serially or in parallel. An order of two or more operations may be changed and two or more operations may be combined into a single operation.

Figure 7C:
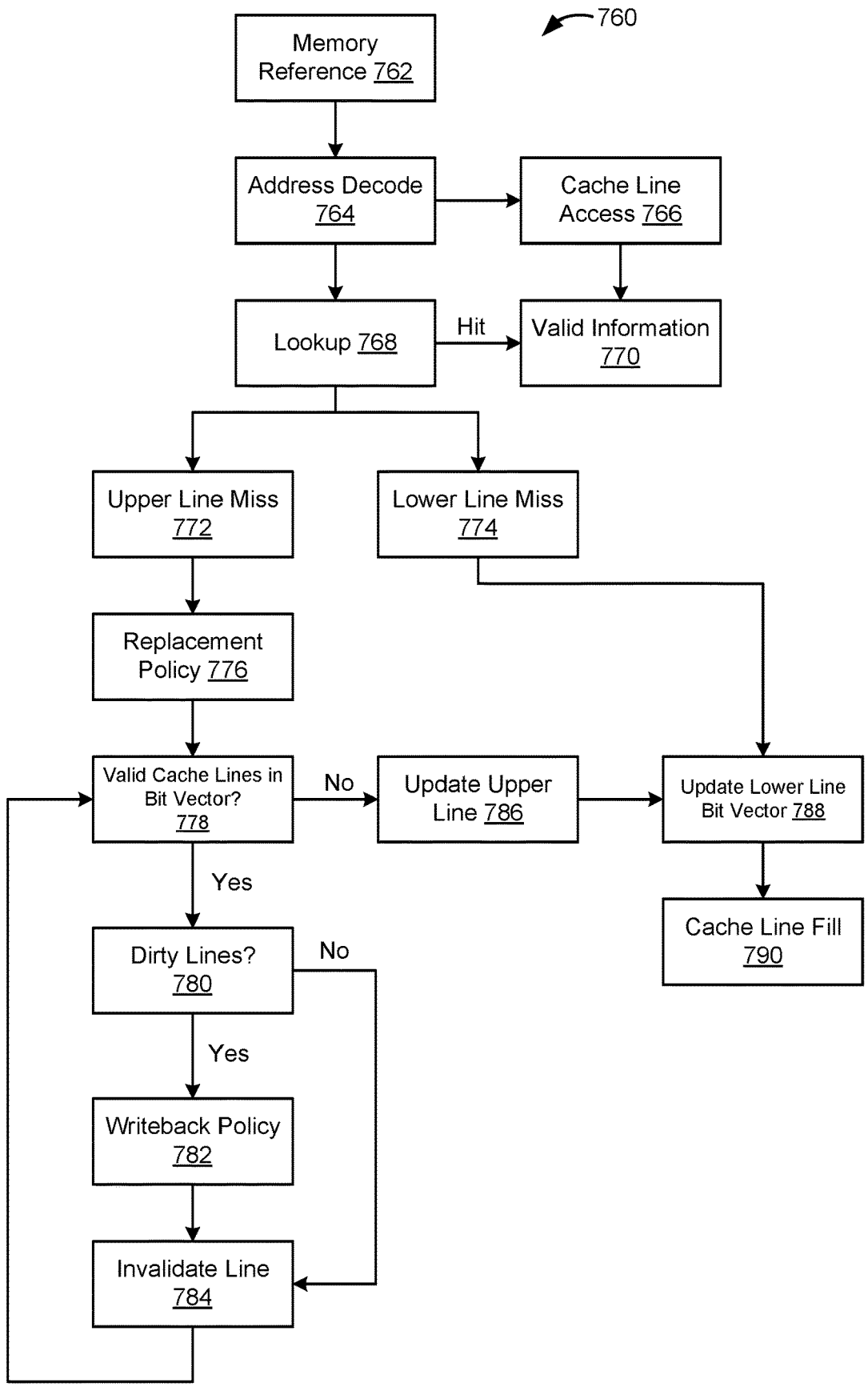

FIG. 7C is a flow diagram illustrating a method 760 of operating a cache memory (e.g., a cache 600 (FIG. 6A), 620 (FIG. 6B), or 640 (FIG. 6C)) in accordance with some embodiments.

In method 760, a memory reference occurs (762) in an instruction executed by a processor (e.g., processor(s) 102, FIG. 1). In response, a physical address (e.g., a physical address 500 (FIGS. 5A, 6A-6B) or 641 (FIG. 6C)) is decoded (764) from the memory reference. A cache line is accessed (766) based on the decoded physical address. For example, a cache line 328 indexed by a second portion 304 of the decoded physical address is accessed (e.g., the information in the cache line 328 is provided to circuitry 414, FIGS. 6A-6C).

A lookup is performed (768) to determine whether the accessed cache line has been allocated to store information associated with the decoded physical address, and thus whether the accessed cache line is valid. The lookup operation 768 corresponds, for example, to the operation 710 (FIG. 7A) or 734 (FIG. 7B), with the decoded physical address being the first physical address of the operation 710 or the second physical address of the operation 734. In some embodiments, the lookup operation is performed using the tables 602-1 through 602-$n$ and logic 606 (FIGS. 6A-6B), or using the tables 642-1 through 642-$n$ and logic 648 (FIG. 6C).

If the lookup operation 768 indicates that the accessed cache line has been allocated to store information associated with the decoded physical address (768-Hit) (e.g., as indicated by a match between the second portion 304 of the decoded physical address and an indication stored in a table entry 520 (FIGS. 6A-6B) or 643 (FIG. 6C) indexed by the first portion 302 of the decoded physical address), then the information accessed from the cache line is determined to be valid (770) and is processed accordingly.

The lookup operation 768 can result in a lower line miss (774), in which a table entry indexed by the first portion 302 of the decoded physical address provides an indication of the first sub-portion 502 (i.e., the upper line) of the decoded physical address but does not provide an indication of the second sub-portion 504 (i.e., the lower line) of the decoded physical address. Thus, for example, in a lower line miss a first set of memory cells 522 in an entry 520 (FIGS. 6A-6B) or 643 (FIG. 6C) indexed by the first portion 302 of the decoded physical address stores a value equal to the first sub-portion 502 of the decoded physical address, but the bit corresponding to the second sub-portion 504 of the decoded physical address in the bit vector 524 ("the corresponding bit") of the entry 520 or 643 is not set to provide an indication of the second sub-portion 504 (e.g., is set to "0," when a setting of "1" would provide an indication of the second sub-portion 504, or vice versa). In response to the lower line miss 774, the bit vector is updated by setting (788) the corresponding bit to provide an indication of the second sub-portion 504. Because the first set of memory cells 522 in the entry 520 or 643 already provides an indication of the first sub-portion 502, setting the corresponding bit (sometimes called the corresponding allocation flag) causes the entry 520 or 643 to provide an indication of the entire second portion 304 of the decoded physical address. In addition, a cache line fill is performed (790): information association with the decoded physical address (e.g., a block of information associated with the first and second portions 302 and 304 of the decoded physical address) is stored in a cache line indexed by the second portion 304 of the decoded physical address. The operations 788 and 790 thus update the cache in response to the lower line miss 774.

The lookup operation 768 can also result in an upper line miss (772), if none of the table entries indexed by the first portion 302 of the decoded physical address provides an indication of the first sub-portion 502 (i.e., the upper line) of the decoded physical address. For example, in an upper line miss none of the entries 520 (FIGS. 6A-6B) or 643 (FIG. 6C) indexed by the first portion 302 of the decoded physical address stores in its first sets of memory cells 522 a value equal to the first sub-portion 502 of the decoded physical address. In response to the upper line miss 772, a replacement policy is implemented (776) to identify a table in which to store an indication of the second portion 304 of the decoded physical address. For example, one of the tables 602-1 through 602-$n$ (FIGS. 6A-6B) or 642-1 through 642-$n$ (FIG. 6C) is chosen at random and the indication is stored in the entry of that table that is indexed by the first portion 302 of the decoded physical address. In another example, of all the entries indexed by the first portion 302 of the decoded physical address, the entry with the fewest number of set bits in its bit vector 524 is chosen. If two or more entries indexed by the first portion 302 of the decoded physical address each have the fewest number of set bits, then one of those entries is chosen in accordance with the replacement policy. In one example, the entry is chosen for which the corresponding valid cache lines are oldest or least recently used. In another example, the entry is chosen that has the least number of corresponding valid cache lines that contain modified data. In yet another example, the entry is chosen based on a rotating value maintained by the cache memory for this purpose, or on a pseudo-random basis.

If the chosen entry does not have any bits set in its bit vector (778-No), and thus does not provide an indication of any second portions 304 and therefore of any valid cache lines, then the upper line of the chosen entry is updated (786), for example by storing the value of the first sub-portion 502 of the decoded physical address in the first set of memory cells 522 of the chosen entry. The lower line bit vector (e.g., 524, FIGS. 6A-6C) of the chosen entry is also updated (788), for example, by setting the bit corresponding to the second sub-portion 504 of the decoded physical address, and a cache line fill is performed (790), as described above for a lower line miss 774.

If the chosen entry has one or more bits in its bit vector that have been set to provide indications of corresponding second portions and thus to indicate that corresponding cache lines are valid (778-Yes), then a determination is made (780) as to whether any of these cache lines store information that has been modified. In some embodiments, cache lines containing modified data, often called "dirty" cache lines, are indicated by a "dirty" status bit maintained by the cache for each cache line 328. If a cache line is dirty, a write-back policy is implemented (782) in which the modified information in the dirty cache line is written back to main memory (e.g., main memory 110, FIG. 1). However, operation 782 is omitted if the cache uses a write-through policy. In embodiments in which the cache operates in accordance with a write-through policy, modified data in the cache is automatically written back to main memory at the time the data was modified, and therefore cache lines (including those with modified data) can be evicted from the cache by simply overwriting the corresponding table entries and resetting the valid bits of the evicted cache lines (to invalidate the cache lines). After operation 780 identifies a dirty cache line, and, if needed, writing the modified data back to main memory (782), the dirty cache line is invalidated (784) and the corresponding bit in the bit vector 524 is changed to no longer provide an indication of the second portion 304 that indexed the dirty cache line (i.e., the corresponding bit of the table entry's bit vector is no longer set). The operations 778-784 are repeated until the chosen table entry does not have any bits set in its bit vector (778-No), at which point the operations 786, 788, and 790 are performed. Alternatively, operations 778, 780, 782 and 784 can be replaced by an operation that resets all the bits in the bit vector of the chosen table entry, and an operation that invalidates all the cache lines corresponding to bits in the bit vector (by resetting the valid bits of the entire corresponding set of cache lines).

While method 760 includes a number of operations that appear to occur in a specific order, it should be apparent that method 760 can include more or fewer operations, which can be executed serially or in parallel. An order of two or more operations may be changed and two or more operations may be combined into a single operation.

The foregoing description, for purpose of explanation, has been described with reference to specific embodiments. However, the illustrative discussions above are not intended to be exhaustive or to limit the inventions to the precise forms disclosed. Many modifications and variations are possible in view of the above teachings. The embodiments were chosen and described in order to best explain the principles of the inventions and their practical applications, to thereby enable others skilled in the art to best utilize the inventions and various embodiments with various modifications as are suited to the particular use contemplated.

What is claimed is:

1. A cache memory, comprising:
   cache lines on a die in a semiconductor package to store information within the semiconductor package, the stored information within the semiconductor package being associated with physical addresses comprising at least first and second non-overlapping, distinct predefined portions, the cache lines being indexed by the second portions of respective physical addresses associated with the stored information;
   one or more tables, each table comprising respective table entries indexed by the first portions of the respective physical addresses, wherein the respective table entries in each of the one or more tables store indications of the second portions of respective physical addresses associated with the stored information;
   first circuitry coupled to at least one of the one or more tables to determine whether the second portion of a specified physical address matches the indication, of the second portion of a respective physical address, stored in a table entry identified by the first portion of the specified physical address;
   second circuitry coupled to the cache lines and the first circuitry, to forward information from a cache line identified by the second portion of the specified physical address in accordance with a cache hit signal; and
   the die, configured to be connected to a processor die by through-silicon vias.

2. The cache memory of claim 1, wherein the physical addresses comprise the first, the second, and third non-overlapping, distinct predefined portions.

3. The cache memory of claim 2, wherein:
   the first portions of the physical addresses correspond to groups of most-significant address bits;
   the third portions of the physical addresses correspond to groups of least-significant address bits; and
   the second portions of the physical addresses correspond to groups of address bits between the most-significant address bits and the least-significant address bits.

4. The cache memory of claim 1, wherein the first circuitry is to generate the cache hit signal in accordance with a determination that the second portion of the specified physical address matches the indication, of the second portion of a respective physical address, stored in the table entry identified by the first portion of the specified physical address.

5. The cache memory of claim 4, wherein the first circuitry is to generate the cache hit signal further in accordance with a valid bit corresponding to the second portion of the specified physical address.

6. The cache memory of claim 1, wherein the first circuitry comprises one or more comparators, each coupled to a respective table of the one or more tables, each to compare the second portion of the specified physical address to the indication in the table entry, of the respective table, identified by the first portion of the specified physical address.

7. The cache memory of claim 1, wherein:
the cache lines comprise DRAM; and
the one or more tables comprise SRAM.

8. The cache memory of claim 1, wherein:
the die is a first die; and
the one or more tables are situated on a second die in the semiconductor package.

9. The cache memory of claim 1, wherein a respective table entry of the one or more tables is simultaneously to store a set of indications corresponding to a plurality of physical addresses that share a common first portion, each stored indication corresponding to a set of physical addresses sharing a common second portion and a cache line indexed by the common second portion, each stored indication to indicate whether the corresponding cache line has been allocated to store information for the set of physical addresses corresponding to the common first portion and the common second portion.

10. The cache memory of claim 9, wherein:
the second portions of the physical addresses comprise first and second sub-portions;
the plurality of physical addresses corresponding to the set of indications to be stored in the respective table entry share a common first sub-portion; and
the respective table entry comprises a first set of memory cells to store the common first sub-portion and a second set of memory cells to store a bit vector, respective bits of the bit vector to provide indications of respective second sub-portions.

11. The cache memory of claim 1, wherein:
the second portions of the physical addresses comprise first and second sub-portions; and
a respective table entry of the one or more tables comprises a first set of memory cells to store a value of a first sub-portion and a second set of memory cells to store a bit vector, respective bits of the bit vector to provide indications of respective second sub-portions of respective physical addresses that share a common first sub-portion.

12. The cache memory of claim 1, wherein:
the cache lines comprise multiple distinct sets of cache lines; and
each set of cache lines is indexed by the second portions of respective physical addresses associated with the stored information.

13. An integrated circuit, comprising:
first circuitry to determine whether a cache line, situated on a die within a semiconductor package of a cache memory, stores information associated with a specified physical address, the specified physical address being one of a plurality of physical addresses each comprising at least first and second non-overlapping, distinct predefined portions, the first circuitry comprising logic to determine whether the second portion of the specified physical address matches an indication stored in a corresponding one of a plurality of table entries indexed by respective first portions of the plurality of physical addresses; and
second circuitry to output the information from the cache memory in accordance with a determination that the second portion of the specified physical address matches the indication, wherein the corresponding one of the plurality of table entries is a table entry identified by the first portion of the specified physical address, the cache line is identified by the second portion of the specified physical address, and the die is configured to be connected to a processor die by through-silicon vias.

14. The integrated circuit of claim 13, wherein a respective table entry of the plurality of table entries is simultaneously to store a set of indications corresponding to a plurality of physical addresses that share a common first portion, each stored indication corresponding to a set of physical addresses sharing a common second portion and a cache line indexed by the common second portion, each stored indication to indicate whether the corresponding cache line has been allocated to store information for the set of physical addresses corresponding to the common first portion and the common second portion.

15. The integrated circuit of claim 13, wherein:
the second portions of the physical addresses comprise first and second sub-portions;
the plurality of physical addresses corresponding to the set of indications to be stored in the respective table entry share a common first sub-portion; and
the respective table entry comprises a first set of memory cells to store the common first sub-portion and a second set of memory cells to store a bit vector, respective bits of the bit vector to provide indications of respective second sub-portions.

16. A method of operating a cache memory, comprising:
storing information in cache lines situated on a die within a semiconductor package, the stored information within the semiconductor package being associated with physical addresses comprising at least first and second non-overlapping, distinct predefined portions, the cache lines being indexed by the second portions of respective physical addresses associated with the stored information;
storing in one or more tables indications of the second portions of physical addresses associated with the stored information, the stored indications indexed by the first portions of the respective physical addresses, wherein the die is configured to be connected to a processor die by through-silicon vias;
determining, using first circuitry coupled to at least one of the one or more tables, whether the second portion of a specified physical address matches the indication, of the second portion of a respective physical address, stored in a table entry identified by the first portion of the specified physical address; and
forwarding, using second circuitry coupled to the cache lines and the first circuitry, information from a cache line identified by the second portion of the specified physical address in accordance with a cache hit signal.

17. The method of claim 16, including generating, via the first circuitry, the cache hit signal in accordance with a determination that the second portion of the specified physical address matches the indication, of the second portion of a respective physical address, stored in the table entry identified by the first portion of the specified physical address.

18. The method of claim 17, wherein generating the cache hit signal is further in accordance with a valid bit corresponding to the second portion of the specified physical address.

19. The method of claim 16, wherein the first circuitry comprises one or more comparators, each coupled to a respective table of the one or more tables, each to compare the second portion of the specified physical address to the indication in the table entry, of the respective table, identified by the first portion of the specified physical address.

20. The method of claim 16, wherein the cache lines comprise DRAM, and the one or more tables comprise SRAM.

* * * * *